(12) United States Patent
Abe et al.

(10) Patent No.: US 7,379,362 B2
(45) Date of Patent: *May 27, 2008

(54) SEMICONDUCTOR MEMORY DEVICE HAVING A HIERARCHICAL BIT LINE STRUCTURE

(75) Inventors: Wataru Abe, Hirakata (JP); Mituaki Hayashi, Kyoto (JP); Shuji Nakaya, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 156 days.

This patent is subject to a terminal disclaimer.

(21) Appl. No.: 11/378,384

(22) Filed: Mar. 20, 2006

(65) Prior Publication Data

US 2006/0221754 A1 Oct. 5, 2006

(30) Foreign Application Priority Data

Mar. 31, 2005 (JP) ............................. 2005-103060

(51) Int. Cl.
*G11C 7/00* (2006.01)
(52) U.S. Cl. ............ 365/203; 365/189.09; 365/230.03
(58) Field of Classification Search .......... 365/189.06, 365/203, 230.03, 189.09
See application file for complete search history.

(56) References Cited

U.S. PATENT DOCUMENTS 5,561,626 A 10/1996 Fujii
7,251,184 B2 * 7/2007 Nakaya et al. ......... 365/230.03

FOREIGN PATENT DOCUMENTS

JP 06-176592 6/1994

* cited by examiner

*Primary Examiner*—Hoai V Ho
(74) *Attorney, Agent, or Firm*—McDermott Will & Emery LLP

(57) ABSTRACT

In semiconductor memory devices having hierarchical bit line structures, a transfer transistor provided between a main bit line and a sub-bit line hinders achievement of a high speed and a low voltage. A sub-bit line SBL in a subarray 12 is connected via a first transistor PC1 to a power source voltage, and via a second transistor NC1 to a ground voltage. A main bit line MBLj is connected via a third transistor PD1 to the power source voltage. The gate electrodes of the first transistor PC1 and the second transistor NC1 are connected to the main bit line MBLj, the gate electrode of the third transistor PD1 is connected to the sub-bit line SBL. In an initial state, a voltage of the main bit line MBLj is controlled to be at an H level, and voltages of word lines WLi1 to Wlip are controlled to be at an L level. When a read operation is performed, the voltage of the main bit line MBLj transitions to the L level, and thereafter, the voltage of a selected word line transitions to the H level.

28 Claims, 23 Drawing Sheets

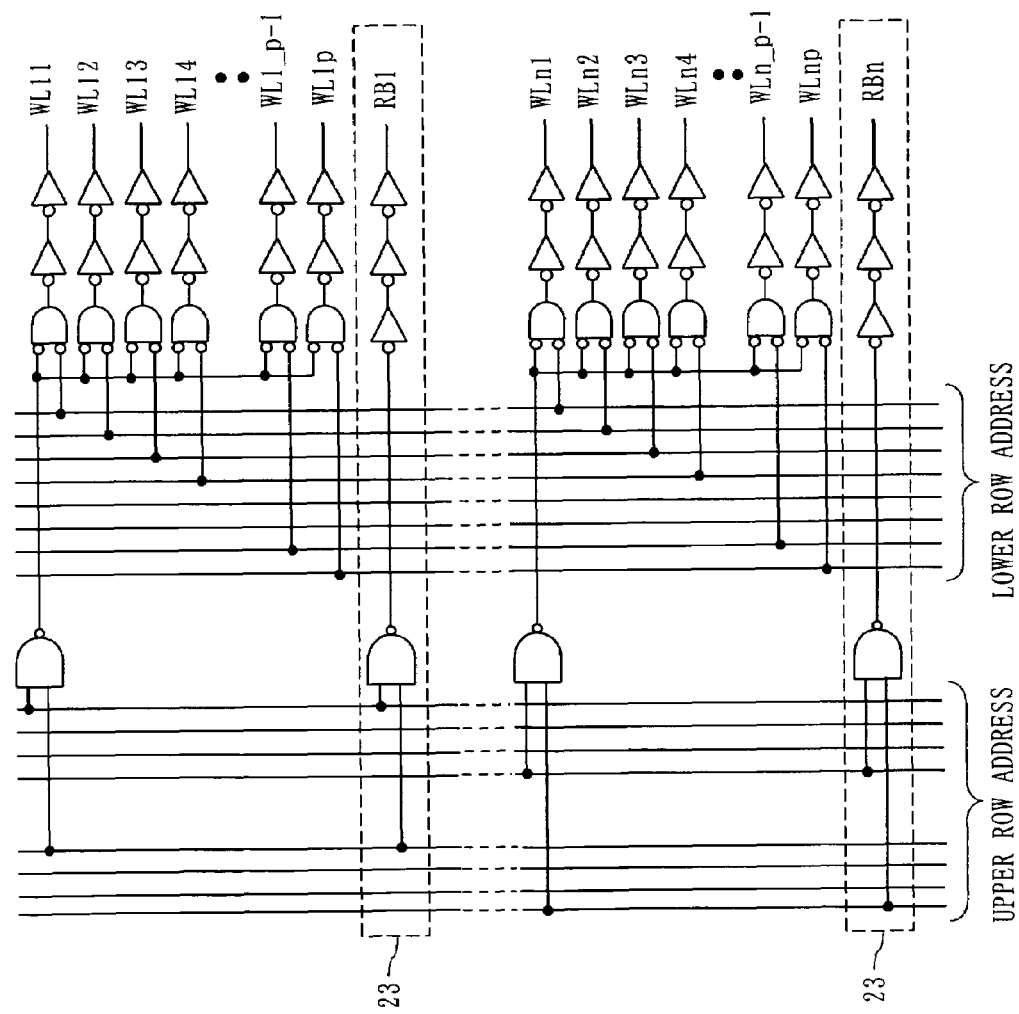
F I G. 5

SEMICONDUCTOR MEMORY DEVICE HAVING A HIERARCHICAL BIT LINE STRUCTURE

BACKGROUND OF THE INVENTION

1. Field of the Invention

The present invention relates to a semiconductor memory device, and more particularly, to a semiconductor memory device having a hierarchical bit line structure.

2. Description of the Background Art

In large-capacity semiconductor memory devices, bit lines are hierarchically arranged in order to prevent the level of the bit line from being reduced due to a cut-off leakage current. For example, Japanese Patent Laid-Open Publication No. 6-176592 (p. 2, FIG. 2) discloses a masked ROM which stores data, depending on the presence or absence of contact connection, as an example of the semiconductor memory device having a hierarchical bit line structure.

FIG. 23 is a block diagram illustrating a structure of a conventional semiconductor memory device described in the above-mentioned document. The semiconductor memory device 90 of FIG. 23 comprises a memory cell array 91 including (n×m) subarrays 92 (MSA11 to MSAnm). The subarrays 92 are connected to n row block select lines RB1 to RBn, (n×p) word lines WL11 to WLnp, and m main bit lines MBL1 to MBLm. The subarrays 92 placed on an i-th row are connected to the row block select line RBi and the word lines WLi1 to WLip, while the subarrays 92 placed on an j-th column are connected to the main bit line MBLj.

A row decoder 8 selects one signal line from the row block select lines RB1 to RBn and one signal line from the word lines WL11 to WLnp based on an row address RA output from an input buffer 1. A column decoder 3 selects one signal line from the main bit lines MBL1 to MBLm based on a column address CA output from the input buffer 1. A sense amplifier 4 amplifies a signal on a selected main bit line. A data output buffer 5 outputs a signal amplified by the sense amplifier 4 to the outside of the semiconductor memory device 90. A precharge circuit 6 charges a selected main bit line. A leakage current compensation circuit 7 supplies electric charge to a selected main bit line in an amount corresponding to a leakage current.

FIG. 24 is a diagram illustrating a structure of the subarray 92 which is placed on the i-th row and the j-th column in the memory cell array 91. The subarray 92 includes a sub-bit line SBL, p memory cells MC1 to MCp, and a transfer gate TG. The memory cells MC1 to MCp and the transfer gate TG are each composed of an N-channel MOS transistor. All of the subarrays 92 in the memory cell array 91 have the same structure as that of FIG. 24.

The transfer gate TG is provided between the main bit line MBLj and the sub-bit line SBL. The row block select line RBi is connected to the gate electrode of the transfer gate TG. The word lines WLi1 to WLip are connected to the gate electrodes of the memory cells MC1 to MCp, respectively. A ground voltage Vss is applied to the source electrodes of the memory cells MC1 to MCp. The drain electrodes of the memory cells MC1 to MCp are connected to the sub-bit line SBL via contact elements (not shown) when data "0" is stored, and are not connected thereto when data "1" is stored. In the example of FIG. 24, the memory cell MC1 stores data 0, while the memory cell MCp stores data 1.

FIG. 25 is a diagram illustrating waveforms during an operation of the semiconductor memory device 90. An operation when data 0 is read from the memory cell MC1 (hereinafter referred to as MCA) in the subarray MSA11 (time intervals T92 to T94), and data 1 is read from the memory cell MCp (hereinafter referred to as MCB) in the subarray MSA11 (time intervals T96 to T98), will be described with reference to FIG. 25.

(1) Time Intervals T91, T95, and T99: Initial State

The row address RA and the column address CA are both in the inactive state. Therefore, all signal lines (the row block select line RB1, the word lines WL11 to WL1p, and the main bit line MBL1) connected to the subarray MSA11 have a voltage of an L level. Therefore, the transfer gate TG and the memory cells MC1 to MCp are in the OFF state, so that the sub-bit line SBL is not connected to any power source lines, and therefore, is in a floating state (high-impedance state). Note that the sub-bit line SBL is not connected to the gate electrode of any MOS transistors, and therefore, even when the sub-bit line SBL is in the high-impedance state, no malfunctions, such as an unstable operation of the transistor, and the like, occur.

(2) Time Intervals T92 and T96: Selection of Main Bit Line

When the column address CA is activated, the main bit line MBL1 is selected, and electric charge is supplied from the precharge circuit 6 to the main bit line MBL1. Since the transfer gate TG is in the OFF state, the main bit line MBL1 is charged to an H level.

(3) Time Intervals T93 and T97: Selection of Row Block Select Line

When the row address RA is activated, the voltage of the row block select line RB1 transitions to the H level. Therefore, the transfer gate TG goes into the ON state, so that the sub-bit line SBL is connected via the transfer gate TG to the main bit line MBL1. Therefore, the sub-bit line SBL is charged to the H level (more exactly, a level obtained by subtracting the threshold voltage of the transfer gate TG from a power source voltage Vdd) via the main bit line MBL1 and the transfer gate TG.

(4) Time Interval T94: Selection of Word Line (when Reading Data 0)

After a predetermined time (specifically, a sufficient time required for the voltage of the sub-bit line SBL to transition to the H level) has elapsed since the row block select line RB1 was selected, the voltage of the word line WL11 transitions to the H level, so that the memory cell MCA transitions to the ON state. The drain electrode of the memory cell MCA storing data 0 is connected via a contact element (not shown) to the sub-bit line SBL. Therefore, the sub-bit line SBL is connected via the memory cell MCA to the ground voltage Vss, so that electric charge supplied from the precharge circuit 6 in the time interval T93 flows via the main bit line MBL1, the transfer gate TG, the sub-bit line SBL, and the memory cell MCA to the ground voltage Vss. Therefore, the voltages of the main bit line MBL1 and the sub-bit line SBL transition to the L level, and an output signal of the sense amplifier 4 connected via the column decoder 3 to the main bit line MBL1 also transitions to the L level. Therefore, data 0 stored in the memory cell MCA can be read via the data output buffer 5 to the outside of the semiconductor memory device 90.

(5) Time Interval T98: Selection of Word Line (when Reading Data 1)

After the predetermined time has elapsed since the row block select line RB1 was selected, the voltage of the word line WL1p transitions to the H level, so that the memory cell MCB transitions to the ON state. The drain electrode of the memory cell MCB storing data 1 is not connected via a contact element to the sub-bit line SBL. Therefore, even after the memory cell MCB transitions to the ON state, the sub-bit line SBL is not connected to the ground voltage Vss, so that electric charge supplied from the precharge circuit 6 during the time interval T97 are still accumulated in wire capacitance possessed by the main bit line MBL1 and the sub-bit line SBL. Therefore, the voltages of the main bit line MBL1 and the sub-bit line SBL are held at the H level, and the output signal of the sense amplifier 4 connected via the column decoder 3 to the main bit line MBL1 is also held at the H level. Therefore, data 1 stored in the memory cell MCB can be read via the data output buffer 5 to the outside of the semiconductor memory device 90.

(6) At Ends of Time Intervals T94 and T98: Completion of Reading

Both of the row address RA and the column address CA return to the inactive state in order to be ready for the next read operation. Therefore, the voltages of the row block select line RB1 and the main bit line MBL1 transition to the L level. At the end of the time interval T94, the voltage of the word line WL11 transitions to the L level, and at the end of the time interval T98, the voltage of the word line WL1p transitions to the L level.

In general, in a memory cell whose drain electrode is connected via a contact element to a bit line, when a word line connected to the gate electrode thereof is in the non-selected state, a leakage current (cut-off leakage current) flows through this memory cell. Therefore, in a semiconductor memory device in which all memory cells provided on the same column are connected to a single bit line, a cut-off leakage current disadvantageously reduces the voltage of the bit line. By contrast, in a semiconductor memory device having a hierarchical bit line structure (e.g., the semiconductor memory device 90 of FIG. 23), memory cells provided on the same column are divided into subarray units, and are connected to sub-bit lines provided in corresponding subarrays. Thereby, it is possible to prevent the cut-off leakage current from reducing the voltage of the bit line. Therefore, even when finer patterning is achieved and the number of memory cells arranged in a column direction becomes so large that a significant cut-off leakage current occurs, a large-scale memory cell array can be achieved by arranging bit lines hierarchically.

However, in a semiconductor memory device in which a MOS transistor is inserted between a main bit line and a sub-bit line, and a row block select line is connected to the gate electrode of the MOS transistor, the following problem arises. For example, in the subarray 92 of FIG. 24, the sub-bit line SBL is precharged via the transfer gate TG after the main bit line MBLj is charged using the precharge circuit 6. In this case, since the transfer gate TG has ON-resistance, a time required for precharging of the sub-bit line SBL is long. Generally, in semiconductor memory devices, a word line is selected after a predetermined time (a sufficient time for a stable read operation) has elapsed since completion of precharging of a bit line. Therefore, if the precharge time of a sub-bit line increases, an access time of the semiconductor memory device increases.

An influence of the transfer gate ON-resistance becomes significant as an operating voltage decreases. For example, in the semiconductor memory device 90 of FIG. 23, when data 0 is read from the memory cell MCA, a steady-state current flows through a path to the ground voltage Vss via the main bit line MBL1, the transfer gate TG, the sub-bit line SBL, and the memory cell MCA. In this case, the transfer gate TG has a gate-source voltage Vgs which is substantially equal to the sum of a threshold voltage Vth of the memory cell MCA and a voltage drop due to the sub-bit line SBL. On the other hand, since the transfer gate TG has a connection form as a source follower, the threshold voltage Vth of the transfer gate TG is higher than that of a typical N-channel MOS transistor due to the substrate bias effect. In this case, if the gate voltage of the transfer gate TG decreases with a decrease in the operating voltage, the gate-source voltage Vgs of the transfer gate TG decreases. If the operating voltage further decreases, the gate-source voltage Vgs, in an extreme case, becomes the threshold voltage Vth or less, so that the transfer gate TG may be cut off (in other words, the ON-resistance of the transfer gate TG becomes extremely high). Thus, the presence of the transfer gate TG is responsible not only for an increase in the access time, but also for hindrance of achievement of a low voltage.

The above-described problem is significant for high-speed and low-power-consumption semiconductor memory devices which are used in mobile information apparatuses or the like. Therefore, in recent years, a method of canceling a reduction in threshold voltage by increasing the gate voltages of a portion of N-channel MOS transistors, and a method of reducing the threshold voltage of a specific N-channel MOS transistor into a lower level than those of the other N-channel MOS transistors, have been proposed. However, in the former method, a large-scale power source circuit is required, so that the chip area and the circuit cost increase. In the latter method, a specialized step for reducing the threshold voltage of a specific N-channel MOS transistor is required, so that the circuit cost increases.

SUMMARY OF THE INVENTION

Therefore, an object of the present invention is to provide a high-speed and low-voltage semiconductor memory device having a hierarchical bit line structure.

A semiconductor memory device with a hierarchical bit line structure according to the present invention comprises a plurality of subarrays arranged in a row direction and a column direction, a plurality of word lines connected to the subarrays placed on the respective same rows, a plurality of main bit lines connected to the subarrays placed on the respective same columns, a row decoder for selecting one of the word lines, based on a given row address, a column decoder for selecting one of the main bit lines, based on a given column address, and a main bit line control circuit for controlling the main bit line selected by the column decoder. The subarray includes a sub-bit line, a first switch section for switching whether or not the sub-bit line is connected to a power source voltage, a second switch section for switching whether or not the sub-bit line is connected to a ground voltage, a third switch section for switching whether or not the main bit line is connected to a predetermined power source, based on a voltage of the sub-bit line, and a plurality of memory cells for applying an influence depending on data stored therein, onto the sub-bit line, when a corresponding one of the word lines is selected.

According to this semiconductor memory device, it is possible to remove an influence of ON-resistance in a transfer gate. Further, data can be read from a memory cell with high speed and a read limit voltage can be reduced in a low voltage region in which a significant mismatch occurs between a threshold voltage and a power source voltage.

In the semiconductor memory device of the present invention, the voltage of the sub-bit line is caused to be at a first level when one of the first and second switch section becomes conductive, before a read operation. The memory cell, when a corresponding word line is selected, does or does not connect a node having a voltage of a second level different from the first level with the sub-bit line, depending on data therein. Thereby, the voltage level of the sub-bit line can be switched depending on data stored in the memory cell.

Particularly, after the word line is selected, the voltage of the sub-bit line may have a level which allows the third switch section to be conductive, or a level which does not allow the third switch section to be conductive, depending on a value stored in the memory cell connected to the word line. Thereby, the states of connection between the main bit line and the predetermined power source can be switched, depending on data stored in the memory cell.

Alternatively, the memory cell may have a MOS transistor having a source electrode connected to the power source voltage or the ground voltage, a gate electrode connected to the corresponding word line, and a drain electrode whose connected state with respect to the sub-bit line varies depending on data stored therein. Alternatively, the memory cell may have a MOS transistor having a source electrode connected to the power source voltage or the ground voltage, a drain electrode connected to the sub-bit line, a gate electrode connected to the corresponding word line, and a threshold voltage varying depending on data stored therein. In the latter case, the threshold voltage of the MOS transistor may be so large that conduction is not established between the source electrode and the drain electrode when the stored data has a predetermined value, even if the word line connected to the gate electrode is selected. Thereby, a memory cell can be constructed which applies an influence depending on the stored data onto the voltage of the sub-bit line.

The main bit line control circuit may include a sense amplifier for amplifying a signal on the main bit line selected by the column decoder, a precharge circuit for charging the main bit line selected by the column decoder, and a leakage current compensation circuit for supplying electric charge to the main bit line selected by the column decoder in an amount of corresponding to a leakage current. Thereby, it is possible to control the main bit line selected by the column decoder.

As a first structure, the predetermined power source may supply the power source voltage, the first switch section may include a P-channel MOS transistor having a source electrode connected to the power source voltage, a drain electrode connected to the sub-bit line, and a gate electrode connected to the main bit line, the second switch section may include an N-channel MOS transistor having a source electrode connected to the ground voltage, a drain electrode connected to the sub-bit line, and a gate electrode connected to the main bit line, the third switch section may include a P-channel MOS transistor having a source electrode connected to the predetermined power source, a drain electrode connected to the main bit line, and a gate electrode connected to the sub-bit line, and the memory cell may or may not connect a node having a low level voltage with the sub-bit line, depending on data stored therein, when the corresponding word line is selected.

In this case, a voltage of the main bit line may be controlled, initially, to be at a high level, and, before a read operation, to be at a low level, and a voltage of the word line may be controlled, initially, to be at a level corresponding to a non-selected state, and, after the voltage of the main bit line is controlled to be at the low level, to be at a level corresponding to a selected state. Particularly, after the voltage of the word line is controlled to be at the level corresponding to the selected state, the voltage of the sub-bit line may be at a low level which is equal to or lower than a threshold voltage of the third switch section, or at a high level which is higher than the threshold voltage of the third switch section, depending on a value stored in the memory cell connected to the word line. In addition, the first switch section may have a current drive ability smaller than that of the single memory cell, and may be larger than a total amount of cut-off leakage currents of all of the memory cells connected to the single sub-bit line.

Thereby, it is possible to remove an influence of ON-resistance in a transfer gate. Further, data can be read from a memory cell with high speed and a read limit voltage can be reduced in a low voltage region in which a significant mismatch occurs between a threshold voltage and a power source voltage. Furthermore, the drain-source voltage Vds of a memory cell in the ready state is 0 V, whereby a consumed current in the ready state can be reduced.

The semiconductor memory device of the present invention may further comprise a plurality of row block select lines connected to the subarrays on the respective rows. The row decoder may select one of the row block select lines. Thereby, semiconductor memory devices having second to fourth structures described below can be obtained.

In the second structure, the predetermined power source may supply the power source voltage, the first switch section may include a P-channel MOS transistor having a source electrode connected to the power source voltage, a drain electrode connected to the sub-bit line, and a gate electrode connected to the row block select line, the second switch section may include an N-channel MOS transistor having a source electrode connected to the ground voltage, a drain electrode to the sub-bit line, and a gate electrode connected to the main bit line, the third switch section may include a P-channel MOS transistor having a source electrode connected to the predetermined power source, a drain electrode connected to the main bit line, and a gate electrode connected to the sub-bit line, and the memory cell may or may not connect a node having a low level voltage with the sub-bit line, depending on data stored therein, when the corresponding word line is selected.

In this case, a voltage of the main bit line may be controlled, initially, to be at a low level, a voltage of the word line is controlled, initially, to be at a level corresponding to a non-selected state, and, before a read operation, to be a level corresponding to a selected state, and a voltage of the row block select line may be controlled, initially, to be at a low level, and, after the voltage of the word line is controlled to be at the level corresponding to the selected state, to be at a high level. Particularly, after the voltage of the row block select line is controlled to be at the high level, the voltage of the sub-bit line is at a low level which is equal to or lower than a threshold voltage of the third switch section, or at a high level which is higher than the threshold voltage of the third switch section, depending on a value stored in the memory cell connected to the word line.

Thereby, it is possible to remove an influence of ON-resistance in a transfer gate. Further, data can be read from a memory cell with high speed and a read limit voltage can be reduced in a low voltage region in which a significant mismatch occurs between a threshold voltage and a power source voltage. Furthermore, the semiconductor memory device of this embodiment has the following advantages over the semiconductor memory device of the first structure: (1) the voltage of a main bit line can be easily controlled by providing switching means for short-circuiting the main bit line and the ground voltage Vss; and (2) power consumption can be reduced by inactivating an operation of a subarray which is not selected.

In the third structure, the predetermined power source supplies the ground voltage, the first switch section includes a P-channel MOS transistor having a source electrode connected to the power source voltage, a drain electrode connected to the sub-bit line, and a gate electrode connected to the row block select line, the second switch section includes an N-channel MOS transistor having a source electrode connected to the ground voltage, a drain electrode to the sub-bit line, and a gate electrode connected to the row block select line, the third switch section includes an N-channel MOS transistor having a source electrode connected to the predetermined power source, a drain electrode connected to the main bit line, and a gate electrode connected to the sub-bit line, and the memory cell may or may not connect a node having a low level voltage with the sub-bit line, depending on data stored therein, when the corresponding word line is selected.

In this case, a voltage of the main bit line may be controlled, initially, to be at a high level, a voltage of the row block select line may be controlled, initially, to be at a high level, and, before a read operation, to be at a low level, and a voltage of the word line may be controlled, initially, to be at a level corresponding to a non-selected state, and, after the voltage of the row block select line is controlled to be at the low level, to be a level corresponding to a selected state. Particularly, after the voltage of the word line is controlled to be at the level corresponding to the selected state, the voltage of the sub-bit line may be at a high level which is equal to or higher than a threshold voltage of the third switch section, or at a low level which is lower than the threshold voltage of the third switch section, depending on a value stored in the memory cell connected to the word line. In addition, the first switch section may have a current drive ability smaller than that of the single memory cell, and is larger than a total amount of cut-off leakage currents of all of the memory cells connected to the single sub-bit line.

Thereby, the third structure provides the same effect as that of the first structure. Further, the third structure has the following advantages over the first structure: (1) the voltage of a main bit line can be easily controlled by providing switching means for short-ciucuiting the main bit line and the power source voltage Vdd; (2) power consumption can be reduced by inactivating an operation of a subarray which is not selected; and (3) the voltage of a sub-bit line is established early, so that data can be read from a memory cell with further higher speed.

In the fourth structure, the predetermined power source may supply the ground voltage, the first switch section may include a P-channel MOS transistor having a source electrode connected to the power source voltage, a drain electrode connected to the sub-bit line, and a gate electrode connected to the row block select line, the second switch section may include an N-channel MOS transistor having a source electrode connected to the ground voltage, a drain electrode to the sub-bit line, and a gate electrode connected to the main bit line, the third switch section may include an N-channel MOS transistor having a source electrode connected to the predetermined power source, a drain electrode connected to the main bit line, and a gate electrode connected to the sub-bit line, and the memory cell may or may not connect a node having a low level voltage with the sub-bit line, depending on data stored therein, when the corresponding word line is selected.

In this case, a voltage of the main bit line may be controlled, initially, to be at a high level, and, before a read operation, to be at a low level, a voltage of the row block select line may be controlled, initially, to be at a high level, and, after the voltage of the main bit line is controlled to be at the low level, to be at a low level, a voltage of the word line is controlled, initially, to be at a level corresponding to a non-selected state, and, after the voltage of the row block select line is controlled to be at the low level, to be a level corresponding to a selected state, and after the voltage of the word line is controlled to be the level corresponding to the selected state, a voltage of the high level may be applied to the main bit line, and thereafter, the voltage of the main bit line may be at the low level or the high level, depending on whether or not the third switch section is conductive or not. Particularly, after the voltage of the word line is controlled to be at the level corresponding to the selected state, the voltage of the sub-bit line may be at a high level which is equal to or higher than a threshold voltage of the third switch section, or at a low level which is lower than the threshold voltage of the third switch section, depending on a value stored in the memory cell connected to the word line. In addition, the first switch section may have a current drive ability smaller than that of the single memory cell, and may be larger than a total amount of cut-off leakage currents of all of the memory cells connected to the single sub-bit line.

Thereby, the fourth structure provides the same effect as that of the first structure. The fourth structure also has the following advantage over the first structure: power consumption can be reduced by completely inactivating a subarray which is not selected.

In addition, the semiconductor memory device of the present invention may further comprise a current limiting circuit of limiting an amount of a current flowing through the sub-bit line, the current limiting circuit being provided between the first switch section and the power source voltage. The current limiting circuit may include one or more MOS transistors connected in series and each having a gate electrode to which a fixed voltage is applied. The current limiting circuit may include a resistance element. Thereby, a required level of current drive ability for the first switch section can be achieved irrespective of the characteristics of the manufacturing process.

The current limiting circuit may be provided for each of the subarrays. The current limiting circuit may be provided for each set of a plurality of the subarrays. Thereby, a required level of current drive ability for the first switch section can be achieved irrespective of the characteristics of the manufacturing process, and an increase in the layout area can be suppressed.

The semiconductor memory device of the present invention comprises, in a subarray, a third switch section which switches whether or not a main bit line is connected to a predetermined power source, depending on the voltage of a sub-bit line, in place of a transfer gate between a main bit line and a sub-bit line. In addition, data stored in this semiconductor memory device can be correctly read by preferably controlling the voltages of a row block select line, a word line, and a main bit line.

Therefore, according to the semiconductor memory device, an influence of ON-resistance in the transfer gate can be removed. In addition, data can be read from a memory cell with high speed and a read limit voltage can be reduced in a low voltage region in which a significant mismatch occurs between a threshold voltage and a power source voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram illustrating a structure of a row decoder included in the semiconductor memory device of FIG. 4;

DESCRIPTION OF THE PREFERRED EMBODIMENTS

Hereinafter, semiconductor memory devices according to embodiments of the present invention will be described with reference to the accompanying drawings. In first to seventh embodiments, as a semiconductor memory device having a hierarchical bit line structure, a masked ROM which comprises (n×m) subarrays MSA11 to MSAnm arranged in a matrix of n rows×m columns, and stores data, depending on the presence or absence of contact connection, will be described. It is hereinafter assumed that the number of word lines connected to one subarray is p, i is an integer of 1 to n, j is an integer of 1 to m, and k is an integer of 1 to p. Note that, as described below, the present invention is not limited to the masked ROM, and can be applied to other semiconductor memory devices having a hierarchical bit line structure, such as a flash memory, an SRAM, and the like.

First Embodiment

Figure 1:
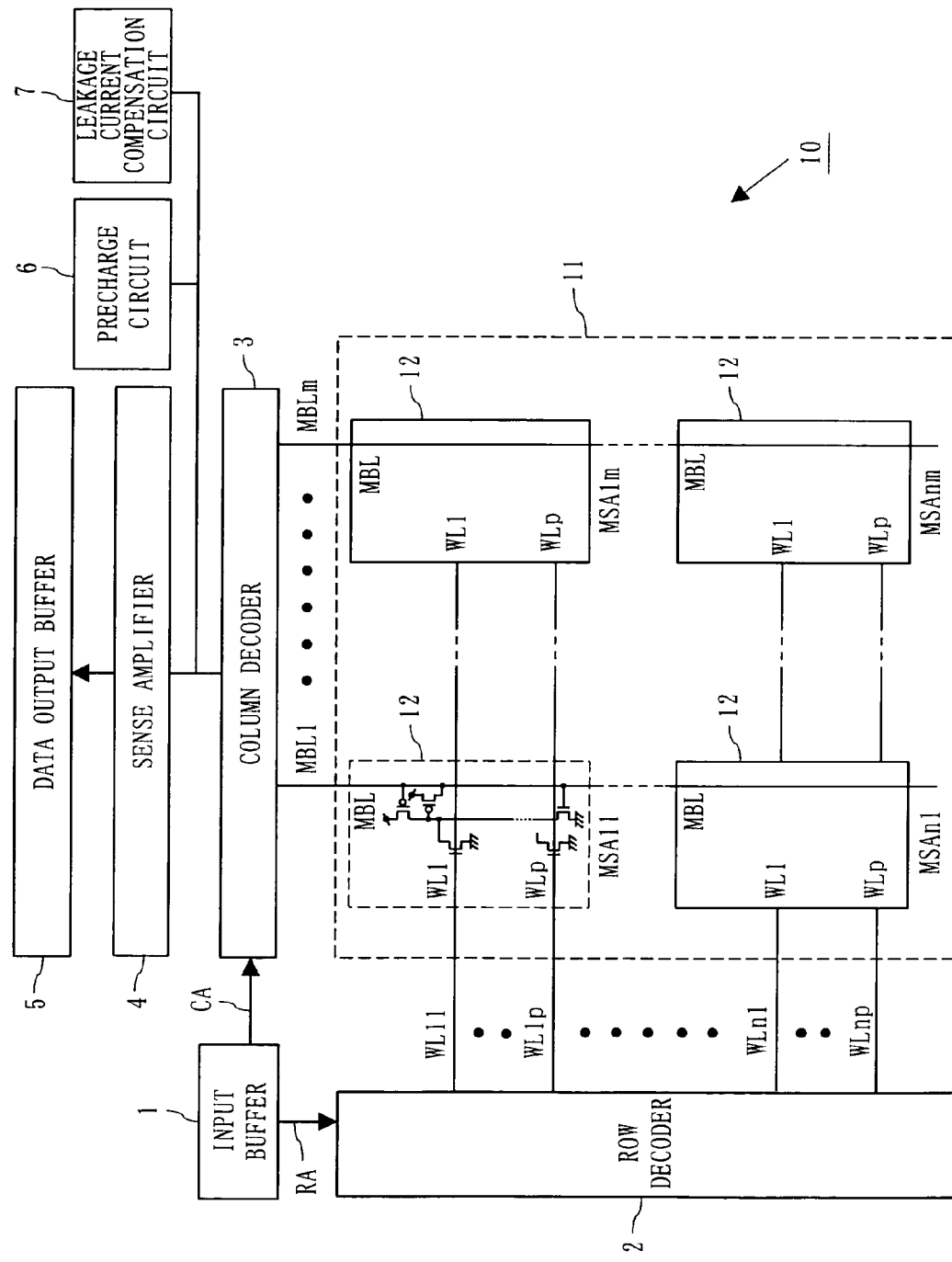
FIG. 1 is a block diagram illustrating a structure of a semiconductor memory device according to a first embodiment of the present invention.

FIG. 1 is a block diagram illustrating a structure of a semiconductor memory device according to a first embodiment of the present invention. The semiconductor memory device 10 of FIG. 1 comprises an input buffer 1, a row decoder 2, a column decoder 3, a sense amplifier 4, a data output buffer 5, a precharge circuit 6, a leakage current compensation circuit 7, and a memory cell array 11. The memory cell array 11 includes (n×m) subarrays 12 (MSA11 to MSAnm) arranged in a row direction and a column direction. The subarrays 12 are connected to (n×p) word lines WL11 to WLnp and m main bit lines MBL1 to MBLm. More specifically, the subarrays 12 placed on an i-th row are connected to the p word lines WLi1 to WLip, while the subarrays 12 placed on a j-th column are connected to the main bit line MBLj. Thus, the subarrays 12 placed on the same row are connected to the same word lines, while the subarrays 12 placed on the same column are connected the same main bit line.

The input buffer 1 performs waveform shaping with respect to an address signal and a control signal which are externally input, and outputs a waveform-shaped signal. The row decoder 2 selects one signal line (e.g., the word line WLik) from the word lines WL11 to WLnp based on a row address RA output from the input buffer 1. The column decoder 3 selects one signal line (e.g., the main bit line MBLj) from the main bit lines MBL1 to MBLm based on a column address CA output from the input buffer 1. The sense amplifier 4 amplifies a signal on the main bit line MBLj selected by the column decoder 3. The data output buffer 5 reads a signal amplified by the sense amplifier 4 and outputs a resultant signal as read data to the outside of the semiconductor memory device 10. The precharge circuit 6 charges (precharges) the main bit line MBLj selected by the column decoder 3. The leakage current compensation circuit 7 supplies electric charge the main bit line MBLj selected by the column decoder 3 in an amount corresponding to a leakage current. The sense amplifier 4, the precharge circuit 6, and the leakage current compensation circuit 7 function as main bit line control circuitry for controlling a main bit line selected by the column decoder 3.

Figure 2:
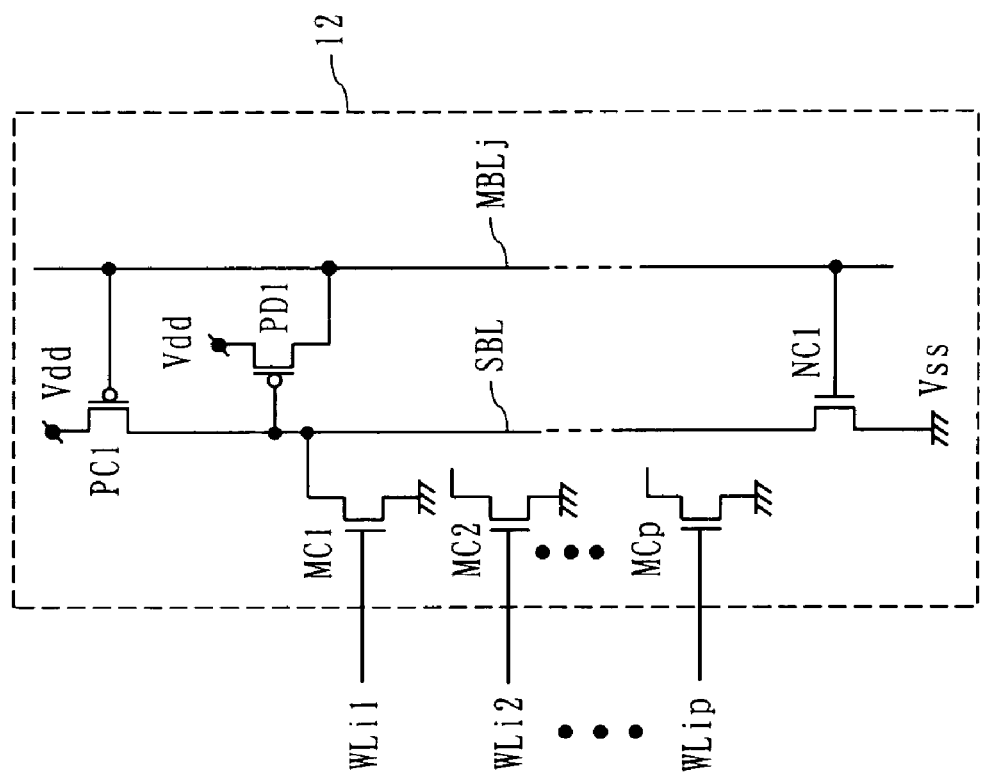
FIG. 2 is a diagram illustrating a structure of a subarray included in the semiconductor memory device of FIG. 1.

FIG. 2 is a diagram illustrating a structure of the subarray 12 placed on the i-th row and the j-th column in the memory cell array 11. The subarray 12 includes a sub-bit line SBL, a first transistor PC1, a second transistor NC1, a third transistor PD1, and p memory cells MC1 to MCp. All of the subarrays 12 in the memory cell array 11 have the same structure as that of FIG. 2.

The first transistor PC1 is a P-channel MOS transistor which has a source electrode connected to a power source voltage Vdd, a drain electrode connected to the sub-bit line SBL, and a gate electrode connected to the main bit line MBLj. The second transistor NC1 is an N-channel MOS transistor which has a source electrode connected to a ground voltage Vss, a drain electrode connected to the sub-bit line SBL, and a gate electrode connected to the main bit line MBLj. The third transistor PD1 is a P-channel MOS transistor which has a source electrode connected to the power source voltage Vdd, a drain electrode connected to the main bit line MBLj, and a gate electrode connected to the sub-bit line SBL. The first transistor PC1 switches whether or not the sub-bit line SBL is connected to the power source voltage Vdd, based on a voltage of the main bit line MBLj. The second transistor NC1 switches whether or not the sub-bit line SBL is connected to the ground voltage Vss, based on the voltage of the main bit line MBLj. The third transistor PD1 switches whether or not the main bit line MBLj is connected to the power source voltage Vdd, based on a voltage of the sub-bit line SBL.

The memory cells MC1 to MCp are each composed of an N-channel MOS transistor. The gate electrodes of the memory cells MC1 to MCp are connected to the word lines WLi1 to WLip, respectively. The source electrodes of the memory cells MC1 to MCp are connected to the ground voltage Vss. The drain electrodes of the memory cells MC1 to MCp are connected via contact elements (not shown) to the sub-bit line SBL when data "1" is stored, and are not connected thereto when data "0" is stored. For example, in the example of FIG. 2, the memory cell MC1 stores data 1 while the memory cell MCp stores data 0. During fabrication of the semiconductor memory device 10, it is determined whether data stored in a memory cell is caused to be 0 or 1 (i.e., whether or not the drain electrode of the memory cell is connected to the sub-bit line SBL).

The memory cell MC1 storing data 1 electrically connects the sub-bit line SBL and the ground voltage Vss during the time when the word line WLi1 is at an H level (selected state) so as to cause the voltage of the sub-bit line SBL to transition to an L level. On the other hand, the memory cell MCp storing data 0 does not electrically connect the sub-bit line SBL and the ground voltage Vss even when the word line WLip transitions to the H level, so that the memory cell MCp does not influence the voltage of the sub-bit line SBL. Thus, the memory cells MC1 to MCp have an influence on the voltage of the sub-bit line SBL, depending on the stored data, when the word lines WLi1 to WLip are selected.

Figure 3:
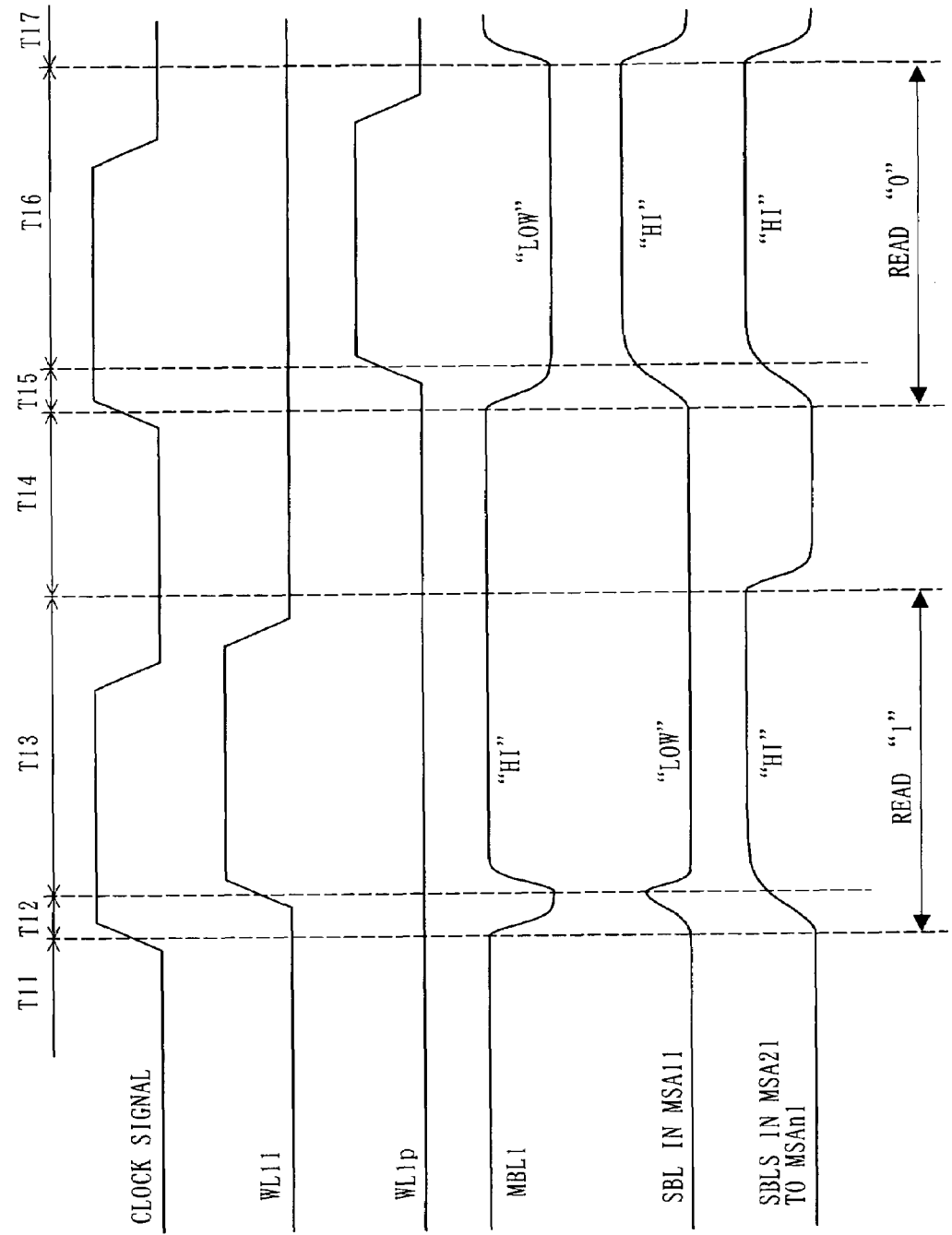
FIG. 3 is a diagram illustrating waveforms during an operation of the semiconductor memory device of FIG. 1.

FIG. 3 is a diagram illustrating waveforms during an operation of the semiconductor memory device 10. An operation when data 1 is read from the memory cell MC1 (memory cell MCA) in the subarray MSA11 (time intervals T12 and T13) and data 0 is read from the memory cell MCp (memory cell MCB) in the subarray MSA11 (time intervals T15 and T16), will be described with reference to FIG. 3.

(1) Time Intervals T11, T14, and T17: Initial State

The row address RA and the column address CA are both in the inactive state. Therefore, among the signal lines connected to the subarray MSA11, the voltages of the word lines WL11 to WL1p are at the L level, and the voltage of the main bit line MBL1 is at the H level. Therefore, the first transistor PC1 is in the OFF state, and the second transistor NC1 is in the ON state. Thereby, the sub-bit line SBL is connected via the second transistor NC1 to the ground voltage Vss, so that the sub-bit line SBL is at the L level. Therefore, the third transistor PD1 is in the ON state. Note that, in an initial state, in all of the subarrays MSA11 to MSAnm, the voltage of the sub-bit line SBL is at the L level, and the third transistor PD1 is in the ON state.

(2) Time intervals T12 and T15: selection of main bit line

When the column address CA is activated, the main bit line MBL1 is selected. The selected main bit line MBL1 is precharged to the L level by an action of the precharge circuit 6. In this case, all of the third transistors PD1 in the n subarrays MSA11 to MSAn1 connected to the main bit line MBL1 are in the ON state, acting so as to hold the voltage of the main bit line MBL1 at the H level. In order to cause the voltage of the main bit line MBL1 to transition to the L level against such an action, the current drive ability of the precharge circuit 6 is adjusted to be greater than the current drive ability of the n third transistors PD1 which are in the ON state.

When the voltage of the main bit line MBL1 transitions to the L level, all of the first transistors PC1 in the subarrays MSA11 to MSAn1 transition to the ON state, and all of the second transistors NC1 therein transition to the OFF state. Therefore, the sub-bit lines SBL in the subarrays MSA11 to MSAn1 are connected via the first transistors PC1 to the power source voltage Vdd, and are precharged to the H level. In association with this, all of the third transistors PD1 in the subarrays MSA11 to MSAn1 transition to the OFF state.

(3) Time Interval T13: Selection of Word Line (when Reading Data 1)

After a predetermined time (specifically, a sufficient time required for the voltage of the sub-bit line SBL to transition to the H level) has elapsed since the start of precharging of the main bit line MBL1, the voltage of the word line WL11 transitions to the H level, so that the memory cell MCA transitions to the ON state. The drain electrode of the memory cell MCA storing data 1 is connected via a contact element (not shown) to the sub-bit line SBL. Therefore, after the memory cell MCA transitions to the ON state, the sub-bit line SBL is connected via the memory cell MCA to the ground voltage Vss. In the time interval T13, since the first transistor PC1 and the memory cell MCA are both in the ON state, the potential of the sub-bit line SBL is a level which is determined by the current drive ability of the first transistor PC1 and the current drive ability of the memory cell MCA. In this embodiment, the current drive ability of the first transistor PC1 is adjusted to be sufficiently smaller than the current drive ability of a single memory cell. Therefore, if the memory cell MCA transitions to the ON state during the time when the first transistor PC1 is in the ON state, the voltage of the sub-bit line SBL decreases. When the voltage of the sub-bit line SBL decreases to a level which is lower than a threshold voltage of the third transistor PD1, the third transistor PD1 transitions to the ON state. Note that, in this case, the third transistors PD1 in the other subarrays MSA21 to MSAn1 connected to the main bit line MBLj are held in the OFF state.

In the time interval T13, the precharge circuit 6 stops the operation, while the leakage current compensation circuit 7 operates. Note that the current drive ability of the leakage current compensation circuit 7 is adjusted to be sufficiently smaller than the current drive ability of the third transistor PD1. Therefore, when the third transistor PD1 in the subarray MSA11 transitions to the ON state, the main bit line MBL1 is connected via the third transistor PD1 to the power source voltage Vdd, and the voltage of the main bit line MBL1 transitions to the H level. In association with this, an output signal of the sense amplifier 4 connected via the column decoder 3 to the main bit line MBL1 also transitions to the H level. Therefore, data 1 stored in the memory cell MCA can be read via the data output buffer to the outside of the semiconductor memory device 10.

(4) Time Interval T16: Selection of Word Line (when Reading Data 0)

After the predetermined time has elapsed since the start of precharging of the main bit line MBL1, the voltage of the word line WL1p transitions to the H level, so that the memory cell MCB transitions to the ON state. The drain electrode of the memory cell MCB storing data 0 is not connected via a contact element to the sub-bit line SBL. Therefore, after the memory cell MCB transitions to the ON state, the sub-bit line SBL is still not connected to the ground voltage Vss. Further, in this embodiment, the current drive ability of the first transistor PC1 is adjusted to be greater than a total amount of cut-off leakage currents of the p memory cells MC1 to MCp connected to the sub-bit line SBL. Therefore, after the voltage of the word line WL1p transitions to the H level, the voltage of the sub-bit line SBL is still held at the H level, the third transistor PD1 is still held in the OFF state, and the voltage of the main bit line MBL1 is still held at the L level. Therefore, data 0 stored in the memory cell MCB can be read via the data output buffer 5 to the outside of the semiconductor memory device 10.

(5) At Ends of Time Intervals T13 and T16: Completion of Read Operation

Both of the row address RA and the column address CA return to the inactive state in order to be ready for the next read operation. Therefore, the voltage of the main bit line MBL1 transitions to the H level. In addition, at the end of the time interval T13, the voltage of the word line WL11 transitions to the L level, and at the end of the time interval T16, the voltage of the word line WL1p transitions to the L level.

As described above, the semiconductor memory device of this embodiment comprises, in a subarray, a P-channel MOS transistor which is inserted between a main bit line and a power source voltage and whose gate electrode is connected to a sub-bit line, in place of a transfer gate inserted between a main bit line and a sub-bit line. In addition, in this semiconductor memory device, data stored in a memory cell can be correctly read by controlling the voltages of a word line and a main bit line as illustrated in FIG. 3.

Therefore, according to the semiconductor memory device of this embodiment, it is possible to remove an influence of ON-resistance in a transfer gate. Further, data can be read from a memory cell with high speed and a read limit voltage can be reduced in a low voltage region in which a significant mismatch occurs between a threshold voltage and a power source voltage. Furthermore, the drain-source voltage Vds of a memory cell in the ready state is 0 V, whereby a consumed current in the ready state can be reduced.

Second Embodiment

Figure 4:
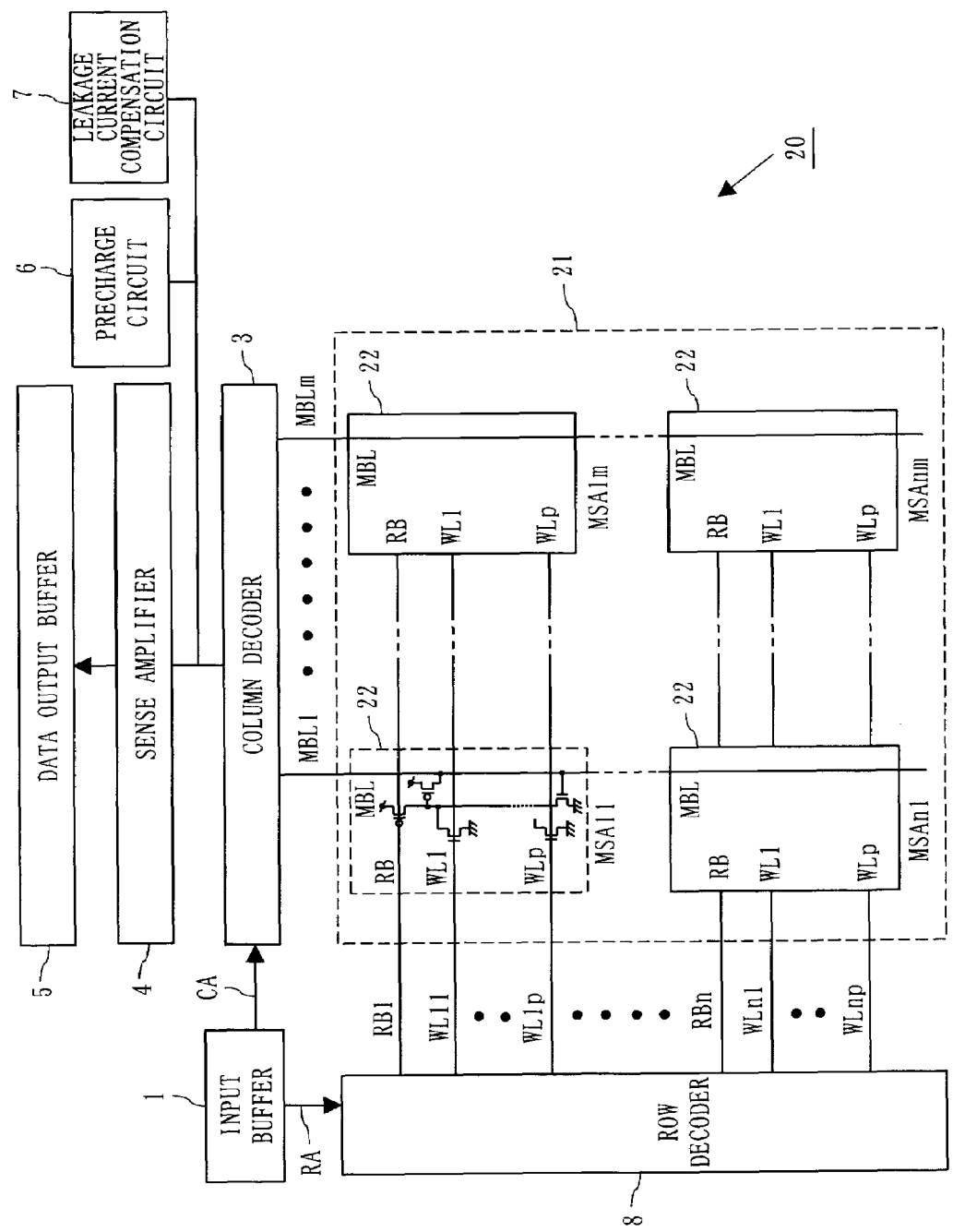
FIG. 4 is a block diagram illustrating a structure of a semiconductor memory device according to a second embodiment of the present invention.

FIG. 4 is a block diagram illustrating a structure of a semiconductor memory device according to a second embodiment of the present invention. The semiconductor memory device 20 of FIG. 4 is the same as the semiconductor memory device 10 (FIG. 1) of the first embodiment, except a memory cell array 21, subarrays 22, and a row decoder 8 are provided in place of the memory cell array 11, the subarrays 12, and the row decoder 2, and row block select lines RB1 to RBn are additionally provided. The same constituents in the second embodiment as those of the first embodiments are indicated with the same reference characters and will not be explained.

As illustrated in FIG. 4, the subarrays 22 in the memory cell array 21 are connected to the n row block select lines RB1 to RBn in addition to the word lines WL11 to WLnp and the main bit lines MBL1 to MBLm. The subarrays 22 placed on the i-th row are connected to the row block select line RBi in addition to the word lines WLi1 to WLip.

FIG. 5 is a diagram illustrating a structure of the row decoder 8. The row decoder 8 of FIG. 5 includes n row block select line control circuits 23 in order to control the n row block select lines RB1 to RBn. Each row block select line control circuit 23 controls the row block select line RBi based on an upper address (described as an upper row address in FIG. 5) of the row address RA. Thus, in the row decoder 8, the upper address of the row address RA which is input so as to control a word line, is also used to control a row block select line. Thereby, the row block select lines RB1 to RBn can be controlled without increasing the bit width of the row address RA.

Figure 6:
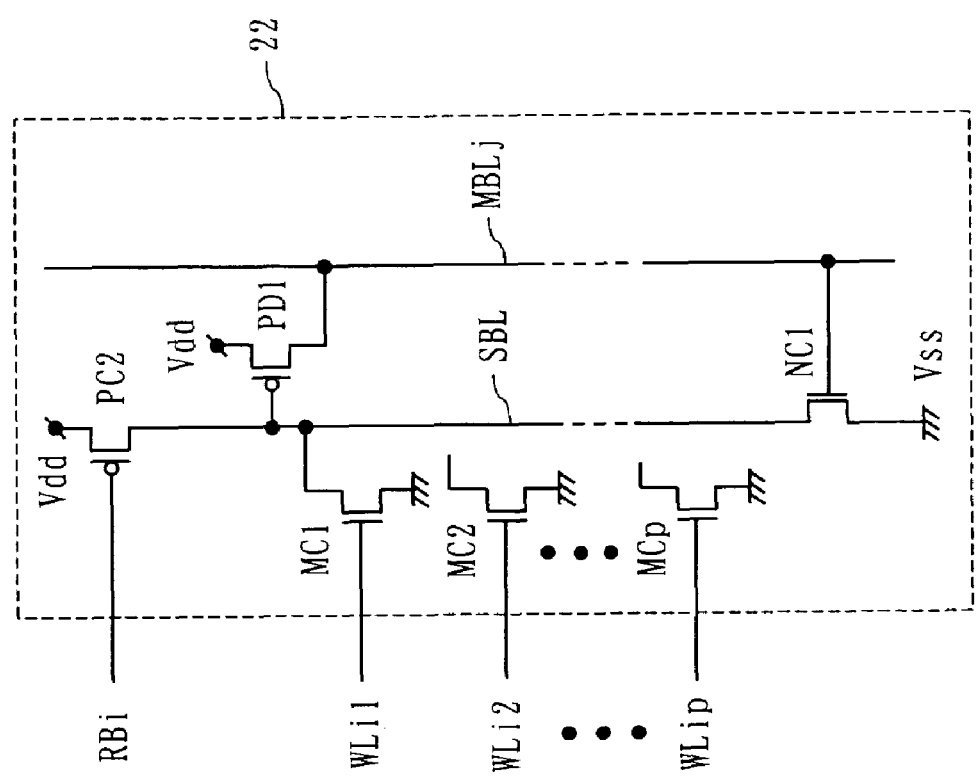
FIG. 6 is a diagram illustrating a structure of a subarray included in the semiconductor memory device of FIG. 4.

FIG. 6 is a diagram illustrating a structure of the subarray 22 placed on the i-th row and the j-th column in the memory cell array 21. The subarray 22 includes a sub-bit line SBL, a first transistor PC2, a second transistor NC1, a third transistor PD1, and p memory cells MC1 to MCp. The subarray 22 is the same as the subarray 12 (FIG. 2) of the first embodiment, except that the first transistor PC2 having a gate electrode connected to the row block select line RBi is provided in place of the first transistor PC1 having a gate electrode connected to the main bit line MBLj. All of the subarrays 22 in the memory cell array 21 have the same structure as that of FIG. 6.

Figure 7:
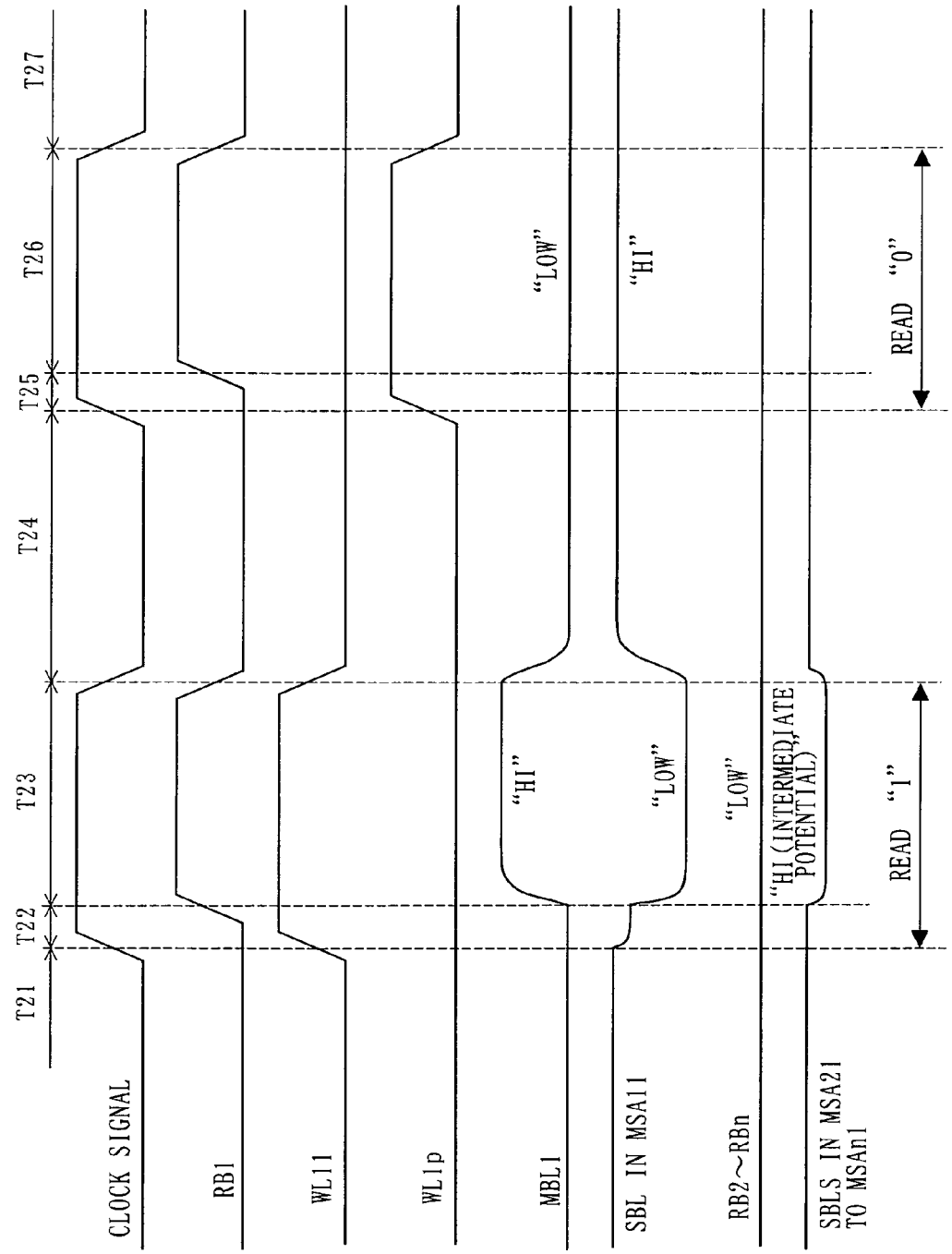
FIG. 7 is a diagram illustrating waveforms during an operation of the semiconductor memory device of FIG. 4.

FIG. 7 is a diagram illustrating waveforms during an operation of the semiconductor memory device 20. An operation when data 1 is read from the memory cell MCA (time intervals T22 and T23), and data 0 is read from the memory cell MCB (time intervals T25 and T26), will be described with reference to FIG. 7.

(1) Time Intervals T21, T24, and T27: Initial State

The row address RA and the column address CA are both in the inactive state. Therefore, all signal lines (the row block select line RB1, the word lines WL11 to WL1p, and the main bit line MBL1) connected to the subarray MSA11 have a voltage of the L level. Therefore, the first transistor PC2 is in the ON state, while the second transistor NC1 is in the OFF state. Thereby, the sub-bit line SBL is connected via the first transistor PC2 to the power source voltage Vdd, so that the voltage of the sub-bit line SBL is at the H level. Therefore, the third transistor PD1 is in the OFF state, so that the main bit line MBL1 is not connected to the power source voltage Vdd. Note that, in an initial state, in all of the subarrays MSA11 to MSAnm, the voltage of the sub-bit line SBL is in the H level, and the third transistor PD1 is in the OFF state.

(2) Time Interval T22: Selection of Word Line (when Reading Data 1)

The voltage of the word line WL11 transitions to the H level in synchronization with a clock signal, so that the memory cell MCA transitions to the ON state. The drain electrode of the memory cell MCA storing data 1 is connected via a contact element (not shown) to the sub-bit line SBL. Therefore, after the memory cell MCA transitions to the ON state, the sub-bit line SBL is connected via the memory cell MCA to the ground voltage Vss. In addition, in this embodiment, the current drive ability of the first transistor PC2 is adjusted so as to be sufficiently greater than the current drive ability of a single memory cell. Therefore, even if the memory cell MCA transitions to the ON state during the time when the first transistor PC2 is in the ON state, the voltage of the sub-bit line SBL does not decrease to a level which is lower than a threshold voltage of the third transistor PD1. Thereby, the third transistor PD1 in the subarray MSA11 is held in the OFF state.

(3) Time Interval T23: Selection of Row Block Select Line (when Reading Data 1)

After a predetermined time has elapsed since the word line WL11 transitioned to the H level, the voltage of the row block select line RB1 transitions to the H level. Therefore, the first transistor PC2 transitions to the OFF state, and the voltage of the sub-bit line SBL transitions to the L level. Therefore, the third transistor PD1 transitions to the ON state, and the main bit line MBL1 is charged to the H level by an action of the third transistor PD1. In association with this, an output signal of the sense amplifier 4 connected via the column decoder 3 to the main bit line MBL1 also transitions the H level. Thereby, data 1 stored in the memory cell MCA can be read via the data output buffer 5 to the outside of the semiconductor memory device 20.

Note that, in the time interval T23, the voltages of the row block select lines RB2 to RBn are at the L level in the other subarrays MSA21 to MSAn1 connected to the main bit line MBL1. Therefore, in the subarrays MSA21 to MSAn1, the first transistor PC2 is held in the ON state, the voltage of the sub-bit line SBL is held at the H level, and the third transistor PD1 is held in the OFF state. On the other hand, when the voltage of the main bit line MBL1 increases to a level which exceeds a threshold voltage of the second transistor NC1, the second transistors NC1 in the subarrays MSA21 to MSAn1 transition to the ON state. Therefore, the voltages of the sub-bit lines SBL in the subarrays MSA21 to MSAn1 are at an H level (intermediate potential which is slightly lower than the typical H level.

(4) Time Interval T25: Selection of Word Line (when Reading Data 0)

The voltage of the word line WLlp transitions to the H level in synchronization with a clock signal, so that the memory cell MCB transitions to the ON state. The drain electrode of the memory cell MCB storing data 0 is not connected via a contact element to the sub-bit line SBL. Therefore, after the memory cell MCB transitions to the ON state, the voltage of the sub-bit line SBL is still held at the H level, the third transistor PD1 is stil held in the OFF state, and the voltage of the main bit line MBL1 is held at the L level.

(5) Time Interval T26: Selection of Row Block Select Line (when Reading Data 0)

After the predetermined time has elapsed since the word line WL11 transitioned to the H level, the voltage of the row block select line RB1 transitions to the H level. However, after the voltage of the row block select line RB1 transitions to the H level, the voltage of the sub-bit line SBL is still held at the H level, the third transistor PD1 is still held in the OFF state, and the voltage of the main bit line MBL1 is still held at the L level. Therefore, the output signal of the sense amplifier 4 connected via the column decoder 3 to the main bit line MBL1 is also held at the L level. Therefore, data 0 stored in the memory cell MCB can be read via the data output buffer 5 to the outside of the semiconductor memory device 20.

(6) At Ends of Time Intervals T23 and T26: Completion of Read Operation

Both of the row address RA and the column address CA return to the inactive state in order to be ready for the next read operation. Therefore, the voltages of the main bit line MBL1 and the row block select line RB1 transition to the L level. At the end of the time interval T23, the voltage of the word line WL11 transitions to the L level, and at the end of the time interval T26, the voltage of the word line WLlp transitions to the L level.

Note that it is an action of the precharge circuit 6 that causes the voltage of the main bit line MBL1 to transition to the L level after completion of a read operation. As the precharge circuit 6 having such an action, an N-channel MOS transistor can be provided which is inserted between the main bit line MBL1 and the ground voltage Vss, has a gate electrode connected to the power source voltage Vdd, and is always in the ON state. Alternatively, as the precharge circuit 6, a resistance element can be used. By using the precharge circuit 6 thus described, the voltages of the main bit lines MBL1 to MBLm can be easily controlled.

As described above, the semiconductor memory device of this embodiment comprises, in a subarray, a P-channel MOS transistor which is inserted between a main bit line and a power source voltage and whose gate electrode is connected to a sub-bit line in place of a transfer gate inserted between a main bit line and a sub-bit line. In addition, in this semiconductor memory device, data stored in a memory cell can be correctly read by controlling the voltages of a row block select line, a word line, and a main bit line as illustrated in FIG. 7.

Therefore, according to the semiconductor memory device of this embodiment, it is possible to remove an influence of ON-resistance in a transfer gate. Further, data can be read from a memory cell with high speed and a read limit voltage can be reduced in a low voltage region in which a significant mismatch occurs between a threshold voltage and a power source voltage. Furthermore, the semiconductor memory device of this embodiment has the following advantages over the semiconductor memory device of the first embodiment: (1) the voltage of a main bit line can be easily controlled by providing means of switching to the ground voltage Vss for short-circuiting; and (2) power consumption can be reduced by inactivating an operation of a subarray which is not selected, though it has a disadvantage that the layout area increases by the areas of row block select lines.

Third Embodiment

Figure 8:
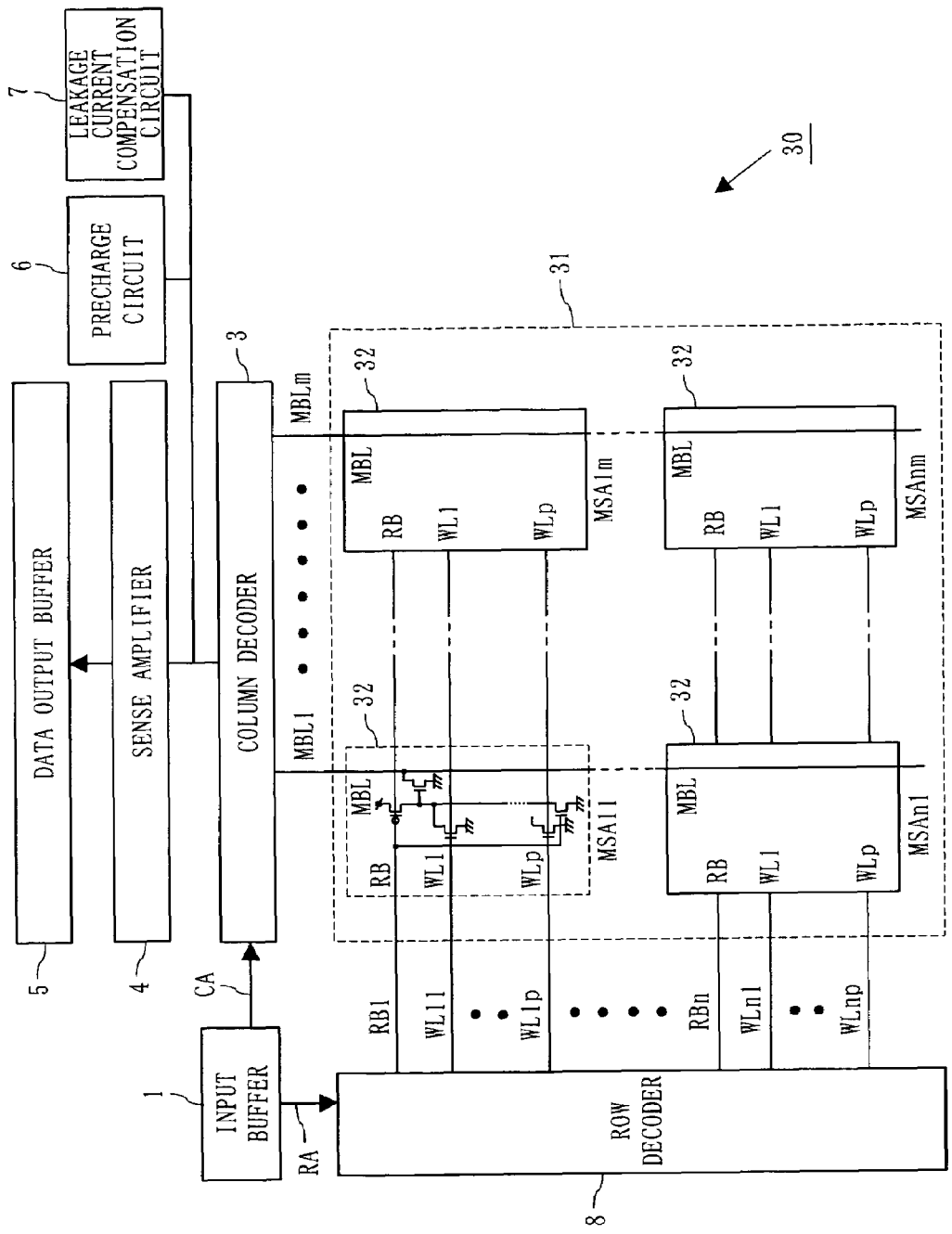
FIG. 8 is a block diagram illustrating a structure of a semiconductor memory device according to a third embodiment of the present invention.

FIG. 8 is a block diagram illustrating a semiconductor memory device according to a third embodiment of the present invention. The semiconductor memory device 30 of FIG. 8 is the same as the semiconductor memory device 20 (FIG. 4) of the second embodiment, except that a memory cell array 31 and the subarrays 32 are provided in place of the memory cell array 21 and the subarrays 22. In the third embodiment, the same constituents as those of the first and second embodiments are indicated with the same reference characters and will not be explained.

Figure 9:
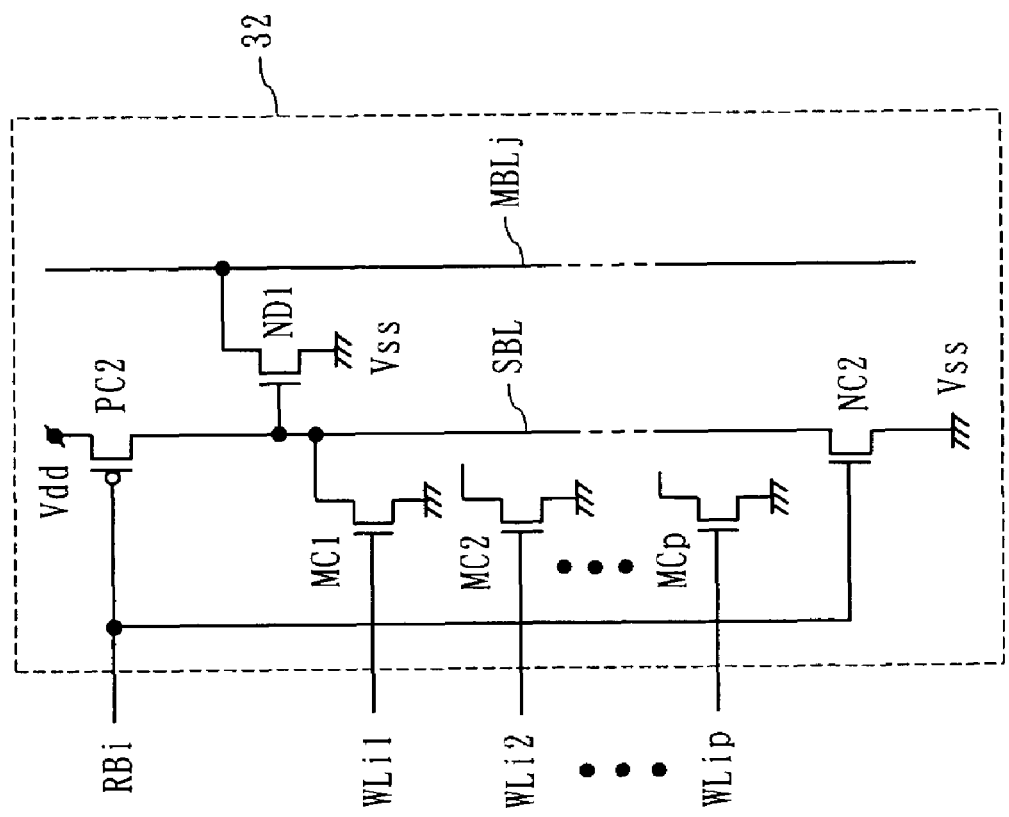
FIG. 9 is a diagram illustrating a structure of a subarray included in the semiconductor memory device of FIG. 8.

FIG. 9 is a structure of the subarray 32 placed on the i-th row and the j-th column in the memory cell array 31. The subarray 32 includes a sub-bit line SBL, a first transistor PC2, a second transistor NC2, a third transistor ND1, and p memory cells MC1 to MCp. The subarray 32 is the same as the subarray 22 (FIG. 6) of the second embodiment, except that the second transistor NC2 having a gate electrode connected to the row block select line RBi is provided in place of the second transistor NC1 having a gate electrode connected to the main bit line MBLj, and the third transistor ND1 composed of an N-channel MOS transistor is provided in place of the third transistor PD1 composed of a P-channel MOS transistor. All of the subarrays 32 in the memory cell array 31 have the same structure as that of FIG. 9.

The third transistor ND1 is an N-channel MOS transistor which has a source electrode connected to the ground voltage Vss, a drain electrode connected to the main bit line MBLj, and a gate electrode connected to the sub-bit line SBL. The third transistor PD1 switches whether or not the main bit line MBLj is connected to the ground voltage Vss, based on the voltage of the sub-bit line SBL.

Figure 10:
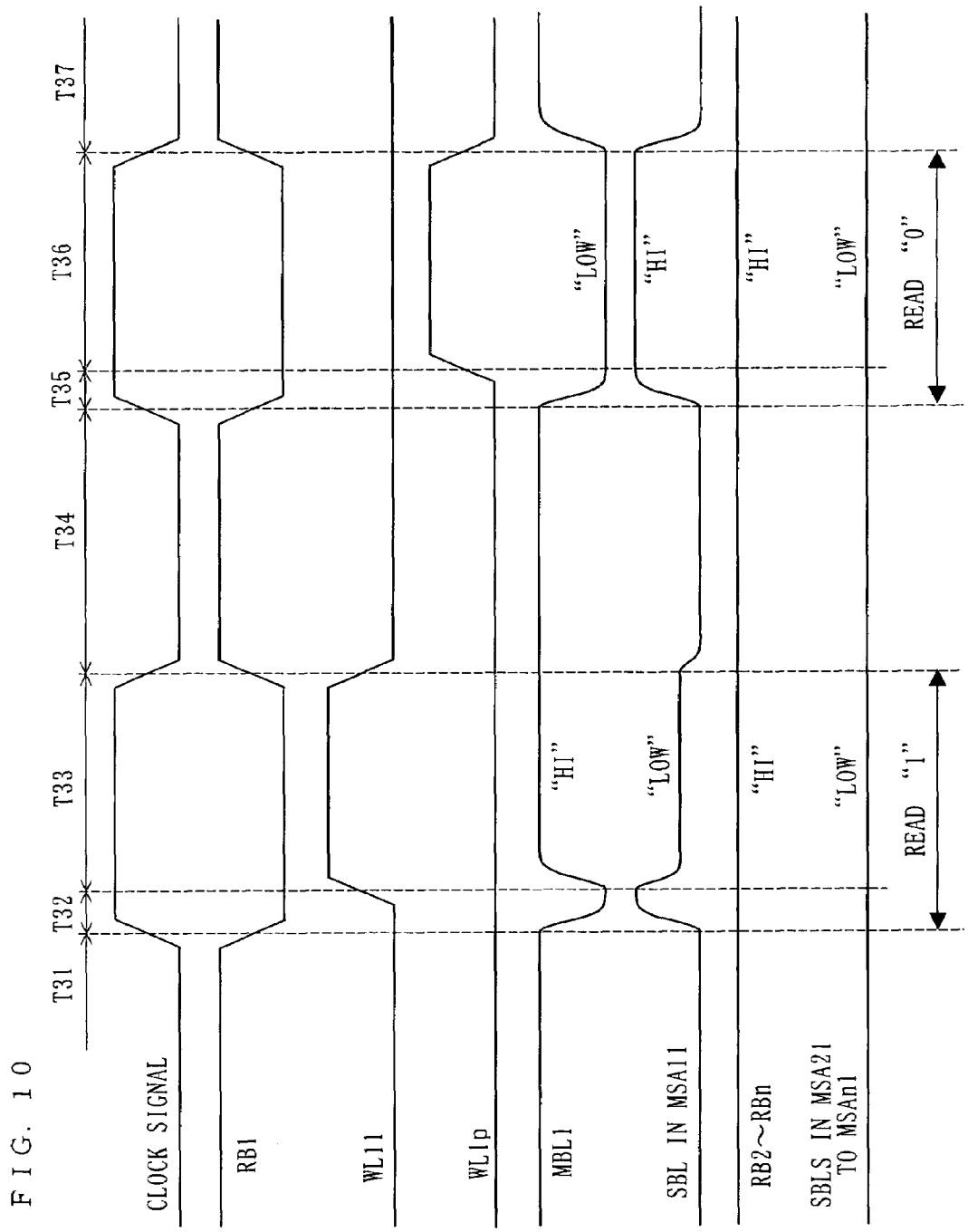
FIG. 10 is a diagram illustrating waveforms during an operation of the semiconductor memory device of FIG. 8.

FIG. 10 is a diagram illustrating waveforms during an operation of the semiconductor memory device 30. An operation when data 1 is read from the memory cell MCA (time intervals T32 and T33), and data 0 is read from the memory cell MCB (time intervals T35 and T36), will be described with reference to FIG. 10.

(1) Time Intervals T31, T34, and T37: Initial State

The row address RA and the column address CA are both in the inactive state. Therefore, among the signal lines connected to the subarray MSA11, the voltages of the word lines WL11 to WLlp are at the L level, while the voltages of the row block select line RB1 and the main bit line MBL1 are at the H level. Therefore, the first transistor PC2 is in the OFF state, while the second transistor NC2 is in the ON state. Therefore, the sub-bit line SBL is connected via the second transistor NC2 to the ground voltage Vss, so that the sub-bit line SBL is at the L level. Therefore, the third transistor ND1 is in the OFF state, so that the main bit line MBL1 is not connected to the ground voltage Vss. Note that, in an initial state, in all of the subarrays MSA11 to MSAnm, the voltage of the sub-bit line SBL is at the L level, and the third transistor ND1 is in the OFF state.

(2) Time Intervals T32 and T35: Selection of Row Block Select Line

The voltage of the row block select line RB1 transitions to the L level in synchronization with a clock signal. Therefore, the first transistor PC2 transitions to the ON state, while the second transistor NC2 transitions to the OFF state. Therefore, the sub-bit line SBL is connected via the first transistor PC2 to the power source voltage Vdd, so that the voltage of the sub-bit line SBL transitions to the H level. Therefore, the third transistor ND1 transitions to the ON state. Therefore, the main bit line MBL1 is connected via the third transistor ND1 to the ground voltage Vss, so that the voltage of main bit line MBL1 transitions to the L level.

(3) Time Interval T33: Selection of Word Line (when Reading Data 1)

After a predetermined time (specifically, a sufficient time required for the voltage of the main bit line MBL1 to transition to the L level) has elapsed since the row block select line RB1 transitioned to the L level, the voltage of the word line WL11 transitions to the H level, and the memory cell MCA transitions to the ON state. The drain electrode of the memory cell MC1 storing data 1 is connected via a contact element (not shown) to the sub-bit line SBL. Therefore, after the memory cell MCA transitions to the ON state, the sub-bit line SBL is connected via the memory cell MCA to the ground voltage Vss. In the time interval T33, both of the first transistor PC2 and the memory cell MCA are in the ON state, so that the potential of the sub-bit line SBL is at a level which is determined by the current drive ability of the first transistor PC2 and the current drive ability of the memory cell MCA. In this embodiment, the current drive ability of the first transistor PC2 is adjusted so as to be sufficiently smaller than the current drive ability of a single memory cell. Therefore, when the memory cell MCA transitions to the ON state during the time when the first transistor PC2 is in the ON state, the voltage of the sub-bit line SBL decreases. When the voltage of the sub-bit line SBL decreases to a level which is lower than a threshold voltage of the third transistor ND1, the third transistor ND1 in the subarray MSA11 transitions to the OFF state.

After the word line WL11 is selected, the precharge circuit 6 tries to precharge the main bit line MBL1 to the H level. In the time interval T33, all of the third transistors ND1 in the subarrays MSA11 to MSAn1 connected to the main bit line MBL1 are in the OFF state. Therefore, the voltage of the main bit line MBLj transitions to the H level by an action of the precharge circuit 6. Therefore, an output signal of the sense amplifier 4 connected via the column decoder 3 to the main bit line MBL1 also transitions to the H level. Thereby, data 1 stored in the memory cell MCA can be read via the data output buffer 5 to the outside of the semiconductor memory device 30.

(4) Time Interval T36: Select of Word Line (when Reading Data 0)

After the predetermined time has elapsed since the voltage of the row block select line RB1 transitions to the L level, the word line WLlp transitions to the H level, so that the memory cell MCB transitions to the ON state. The drain electrode of the memory cell MCB storing data 0 is not connected via a contact element to the sub-bit line SBL. Therefore, after the memory cell MCB transitions to the ON state, the voltage of the sub-bit line SBL is still held at the H level, and the third transistor ND1 is still held at the ON state. In this embodiment, the current drive ability of the third transistor ND1 is adjusted so as to be sufficiently greater than the current drive ability of the precharge circuit 6. Therefore, after the memory cell MCB transitions to the ON state, the voltage of the main bit line MBL1 is still held at the L level. Therefore, the output signal of the sense amplifier 4 connected via the column decoder 3 to the main bit line MBL1 is also held at the L level. Thereby, data 0 stored in the memory cell MCB can be read via the data output buffer 5 to the outside of the semiconductor memory device 30.

(5) At the Ends of Time Intervals T33 and T36: Completion of Read Operation

Both of the row address RA and the column address CA return to the inactive state in order to be ready for the next read operation. Therefore, the voltage of the row block select line RB1 transitions to the H level. At the end of the time interval T33, the voltage of the word line WL11 transitions to the L level, and at the end of the time interval T36, the voltage of the word line WLlp transitions to the L level.

Note that it is an action of the precharge circuit 6 that causes the voltage of the main bit line MBL1 to transition to the H level after a word line is selected. As the precharge circuit 6 having such an action, a P-channel MOS transistor can be provided which is inserted between the main bit line MBL1 and the power source voltage Vdd, has a gate electrode connected to the ground voltage Vss, and is always in the ON state. Alternatively, as the precharge circuit 6, a resistance element can be used. By using the precharge circuit 6 thus described, the voltages of the main bit lines MBL1 to MBLm can be easily controlled.

As described above, the semiconductor memory device of this embodiment comprises, in a subarray, an N-channel MOS transistor which is inserted between a main bit line and a ground voltage and whose gate electrode is connected to a sub-bit line, in place of a transfer gate inserted between a main bit line and a sub-bit line. In addition, in this semiconductor memory device, data stored in a memory cell can be correctly read by controlling the voltages of a row block select line, a word line, and a main bit line as illustrated in FIG. 10.

Therefore, the semiconductor memory device of this embodiment provides the same effect as that of the semiconductor memory device of the first embodiment. Further, the semiconductor memory device of this embodiment has the following advantages over the semiconductor memory device of the first embodiment: (1) the voltage of a main bit line can be easily controlled by providing means of switching to the power source voltage Vdd for short-circuiting; (2) power consumption can be reduced by inactivating an operation of a subarray which is not selected; and (3) the voltage of a sub-bit line is established early, so that data can be read from a memory cell with further higher speed, though it has a disadvantage that the layout area increases by the areas of row block select lines.

Fourth Embodiment

Figure 11:
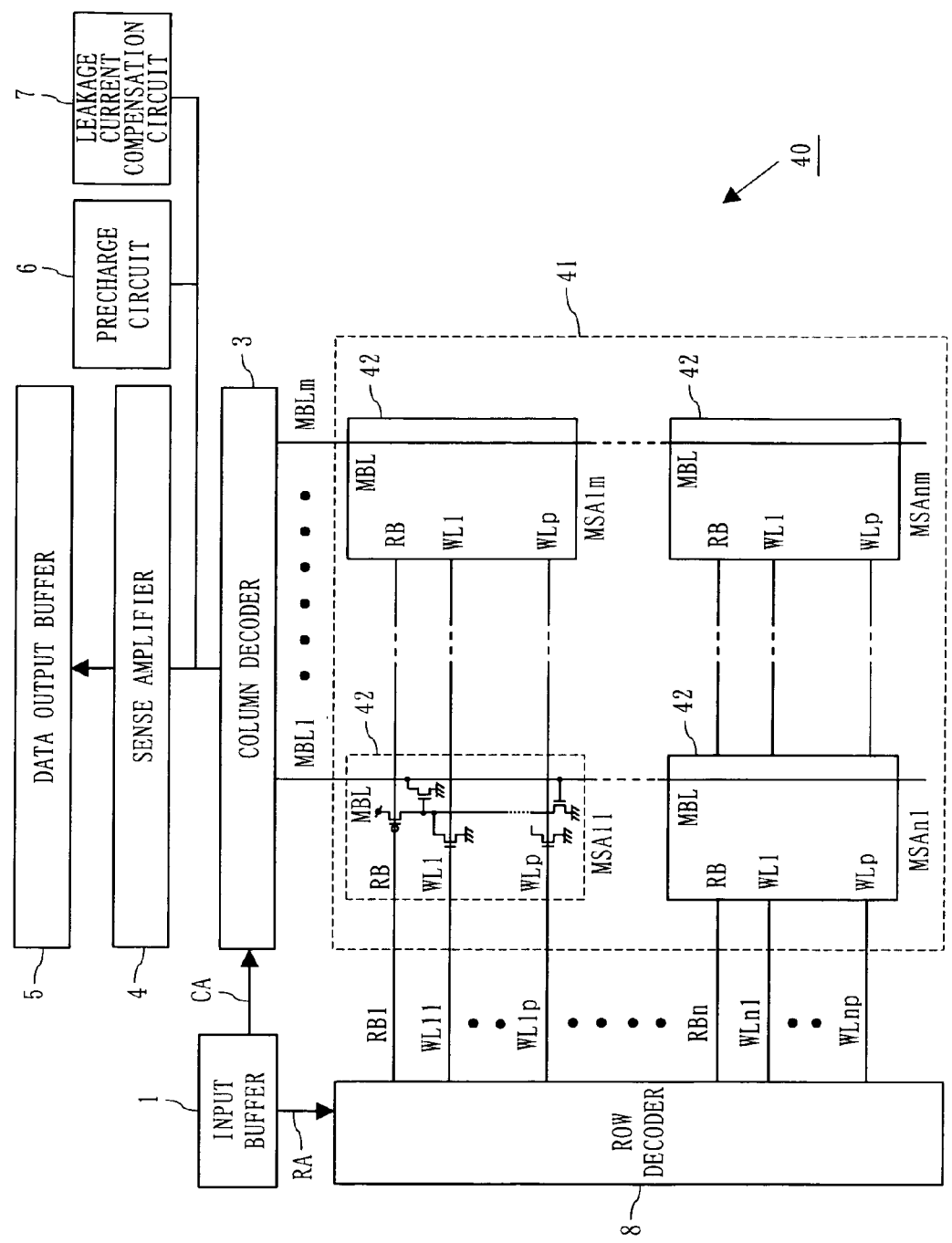
FIG. 11 is a block diagram illustrating a structure of a semiconductor memory device according to a fourth embodiment of the present invention.

FIG. 11 is a block diagram illustrating a semiconductor memory device according to a fourth embodiment of the present invention. The semiconductor memory device 40 of FIG. 11 is the same as the semiconductor memory device 30 (FIG. 8) of the third embodiment, except that a memory cell array 41 and the subarrays 42 are provided in place of the memory cell array 31 and the subarrays 32. In the fourth embodiment, the same constituents as those of the first to third embodiments are indicated with the same reference characters and will not be explained.

Figure 12:
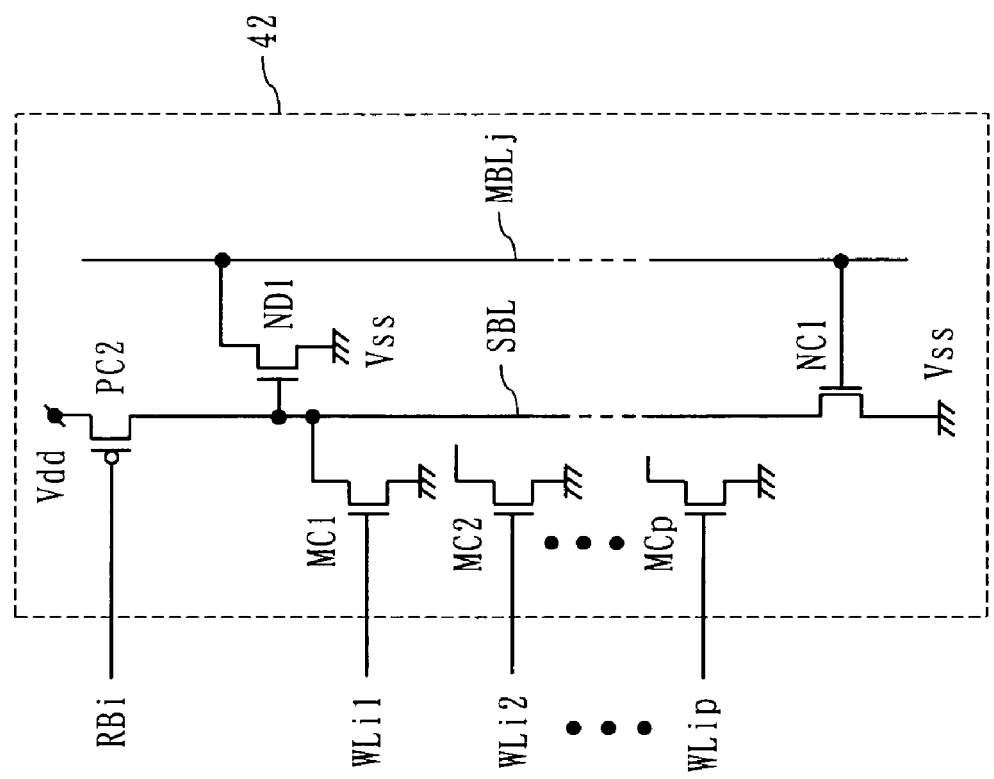
FIG. 12 is a diagram illustrating a structure of a subarray included in the semiconductor memory device of FIG. 11.

FIG. 12 is a structure of the subarray 42 placed on the i-th row and the j-th column in the memory cell array 41. The subarray 42 includes p memory cells MC1 to MCp, a first transistor PC2, a second transistor NC1, and a third transistor ND1. The subarray 42 is the same as the subarray 32 (FIG. 9) of the third embodiment, except that the second transistor NC1 having a gate electrode connected to the main bit line MBLj is provided in place of the second transistor NC2 having a gate electrode connected to the row block select line RBi. All of the subarrays 42 in the memory cell array 41 have the same structure as that of FIG. 12.

Figure 13:
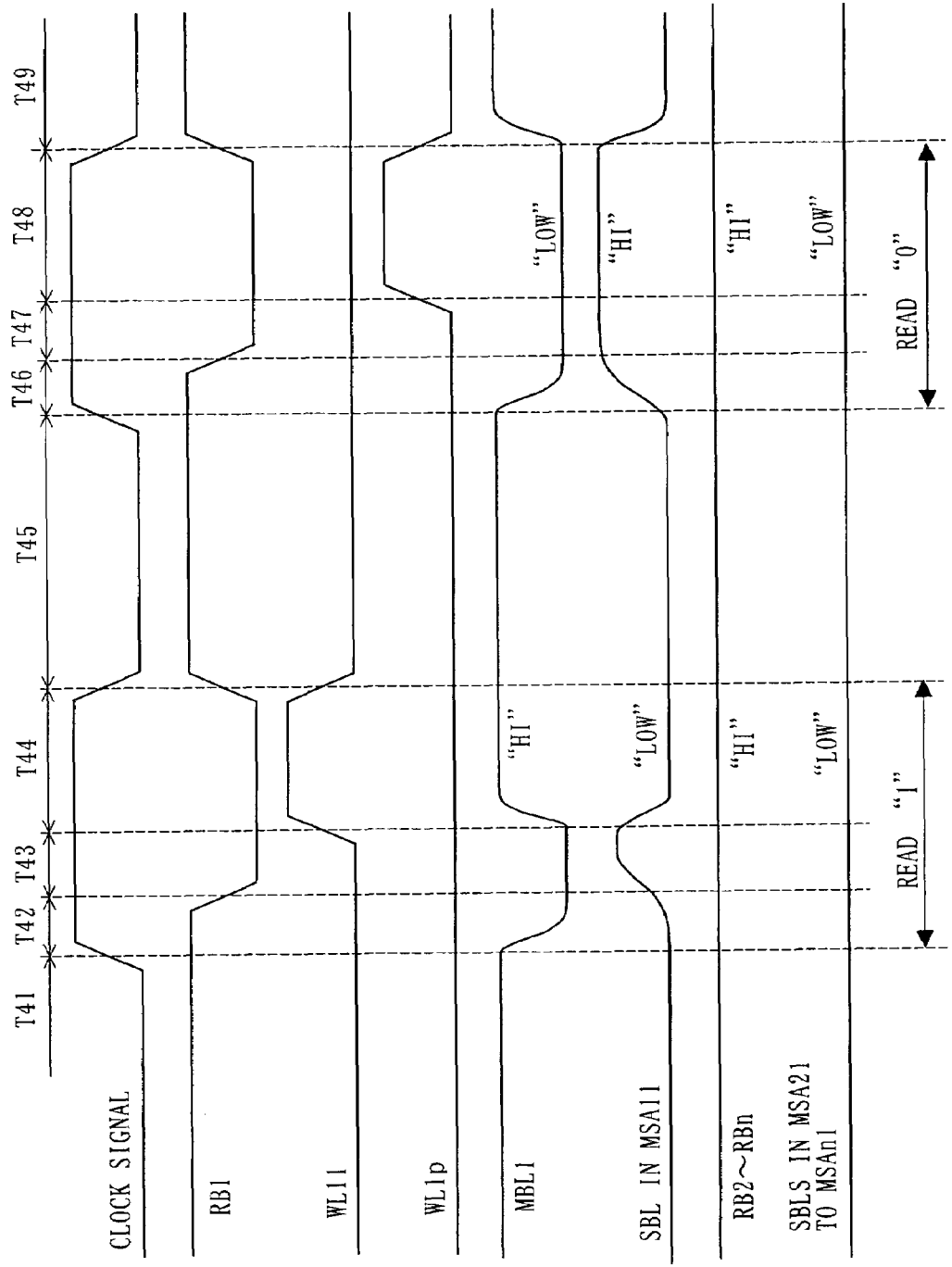
FIG. 13 is a diagram illustrating waveforms during an operation of the semiconductor memory device of FIG. 11.

FIG. 13 is a diagram illustrating waveforms during an operation of the semiconductor memory device 40. An operation when data 1 is read from the memory cell MCA (time intervals T42 to T45), and data 0 is read from the memory cell MCB (time intervals T46 to T48), will be described with reference to FIG. 13.

(1) Time Intervals T41, T45, and T49: Initial State

The row address RA and the column address CA are both in the inactive state. Therefore, among the signal lines connected to the subarray MSA11, the voltages of the word lines WL11 to WL1p are at the L level, while the voltages of the row block select line RB1 and the main bit line MBL1 are at the H level. Therefore, the first transistor PC2 is in the OFF state, while the second transistor NC1 is in the ON state. Thereby, the sub-bit line SBL is connected via the second transistor NC1 to the ground voltage Vss, so that the sub-bit line SBL is at the L level. Therefore, the third transistor ND1 is in the OFF state, so that the main bit line MBL1 is not connected to the ground voltage Vss. Note that, in an initial state, in all of the subarrays MSA11 to MSAnm, the voltage of the sub-bit line SBL is at the L level, and the third transistor ND1 is in the OFF state.

(2) Time Intervals T42 and T46: Selection of Main Bit Line

The main bit line MBL1 is precharged to the L level by an action of the precharge circuit 6 in synchronization with a clock signal. Therefore, the second transistor NC1 transitions to the OFF state. Note that, in the time intervals T42 and T46, in the n subarrays MSA11 to MSAn1 connected to the main bit line MBL1, all of the third transistors ND1 are in the OFF state. Therefore, the current drive ability of the precharge circuit 6 is smaller than that of the first embodiment.

(3) Time Intervals T43 and T47: Selection of Row Block Select Line

After a first predetermined time has elapsed since the start of precharging, the voltage of the row block select line RB1 transitions to the L level. Therefore, the first transistor PC2 transitions to the ON state. Therefore, the sub-bit line SBL is connected via the first transistor PC2 to the power source voltage Vdd, so that the voltage of the sub-bit line SBL transitions to the H level. Therefore, the third transistor ND1 transitions to the ON state. In this embodiment, the current drive ability of the third transistor ND1 is adjusted so as to be sufficiently greater than the current drive ability of the precharge circuit 6. Therefore, even if the precharge circuit 6 performs precharging so as to cause the main bit line MBL1 to transition to the H level, the voltage of the main bit line MBL1 is held at the L level during the time when the third transistor ND1 is in the ON state.

(4) Time Interval T44: Selection of Word Line (when Reading Data 1)

After a second predetermined time has elapsed since the voltage of the row block select line RB1 transitioned to the L level, the word line WL11 transitions to the H level, so that the memory cell MCA transitions to the ON state. The drain electrode of the memory cell MCA storing data 1 is connected via a contact element (not shown) to the sub-bit line SBL. Therefore, after the memory cell MCA transitions to the ON state, the sub-bit line SBL is connected via the memory cell MCA to the ground voltage Vss. In the time interval T44, since both of the first transistor PC2 and the memory cell MCA are in the ON state, the potential of the sub-bit line SBL is at a level which is determined by the current drive ability of the first transistor PC2 and the current drive ability of the memory cell MCA. In this embodiment, the current drive ability of the first transistor PC2 is adjusted so as to be sufficiently smaller than the current drive ability of a single memory cell. Therefore, when the memory cell MCA transitions to the ON state during the time when the first transistor PC2 is in the ON state, the voltage of the sub-bit line SBL decreases. When the voltage of the sub-bit line SBL decreases to a level which is lower than a threshold voltage of the third transistor ND1, the third transistor ND1 in the subarray MSA11 transtions to the OFF state.

When the third transistor ND1 transitions to the OFF state, the main bit line MBL1 is charged to the H level by an action of the precharge circuit 6. Therefore, an output signal of the sense amplifier 4 connected via the column decoder 3 to the main bit line MBL1 also transitions to the H level. Thereby, data 1 stored in the memory cell MCA can be read via the data output buffer 5 to the outside of the semiconductor memory device 40.

(5) Time Interval T48: Selection of Word Line (when Reading Data 0)

After the second predetermined time has elapsed since the voltage of the row block select line RB1 transitioned to the L level, the word line WL1p transitions to the H level, and the memory cell MCB transitions to the ON state. The drain electrode of the memory cell MCB storing data 0 is not connected via a contact element to the sub-bit line SBL. Therefore, after the memory cell MCB transitions to the ON state, the voltage of the sub-bit line SBL is still held at the H level, the third transistor ND1 is still held in the ON state, and the voltage of the main bit line MBL1 is still held at the L level. Therefore, the output signal of the sense amplifier 4 connected via the column decoder 3 to the main bit line MBL1 is also held at the L level. Thereby, data 0 stored in the memory cell MCB can be read via the data output buffer 5 to the outside of the semiconductor memory device 40.

(6) At Ends of Time Intervals T44 and T48: Completion of Read Operation

Both of the row address RA and the column address CA return to the inactive state in order to be ready for the next read operation. Therefore, the voltages of the main bit line MBL1 and the row block select line RB1 transition to the H level. In addition, at the end of the time interval T44, the voltage of the word line WL11 transitions to the L level, and at the end of the time interval T48, the voltage of the word line WL1p transitions to the L level.

As described above, the semiconductor memory device of this embodiment comprises, in a subarray, an N-channel MOS transistor which is inserted between a main bit line and a ground voltage and whose gate electrode is connected to a sub-bit line in place of a transfer gate inserted between a main bit line and a sub-bit line. In addition, in this semiconductor memory device, data stored in a memory cell can be correctly read by controlling the voltages of a row block select line, a word line, and a main bit line as illustrated in FIG. 13.

Therefore, the semiconductor memory device of this embodiment provides the same effect as that of the semiconductor memory device of the first embodiment. The semiconductor memory device of this embodiment has a disadvantage that the layout area increases by the areas of row block select lines, as compared to the semiconductor memory device of the first embodiment, and has a degree of complication of controlling the voltage of a main bit line which is similar to that of the semiconductor memory device of the first embodiment. However, the semiconductor memory device of this embodiment has the following advantage over the semiconductor memory device of the first embodiment: power consumption can be reduced by completely inactivating a subarray which is not selected.

Fifth Embodiment

Figure 14:
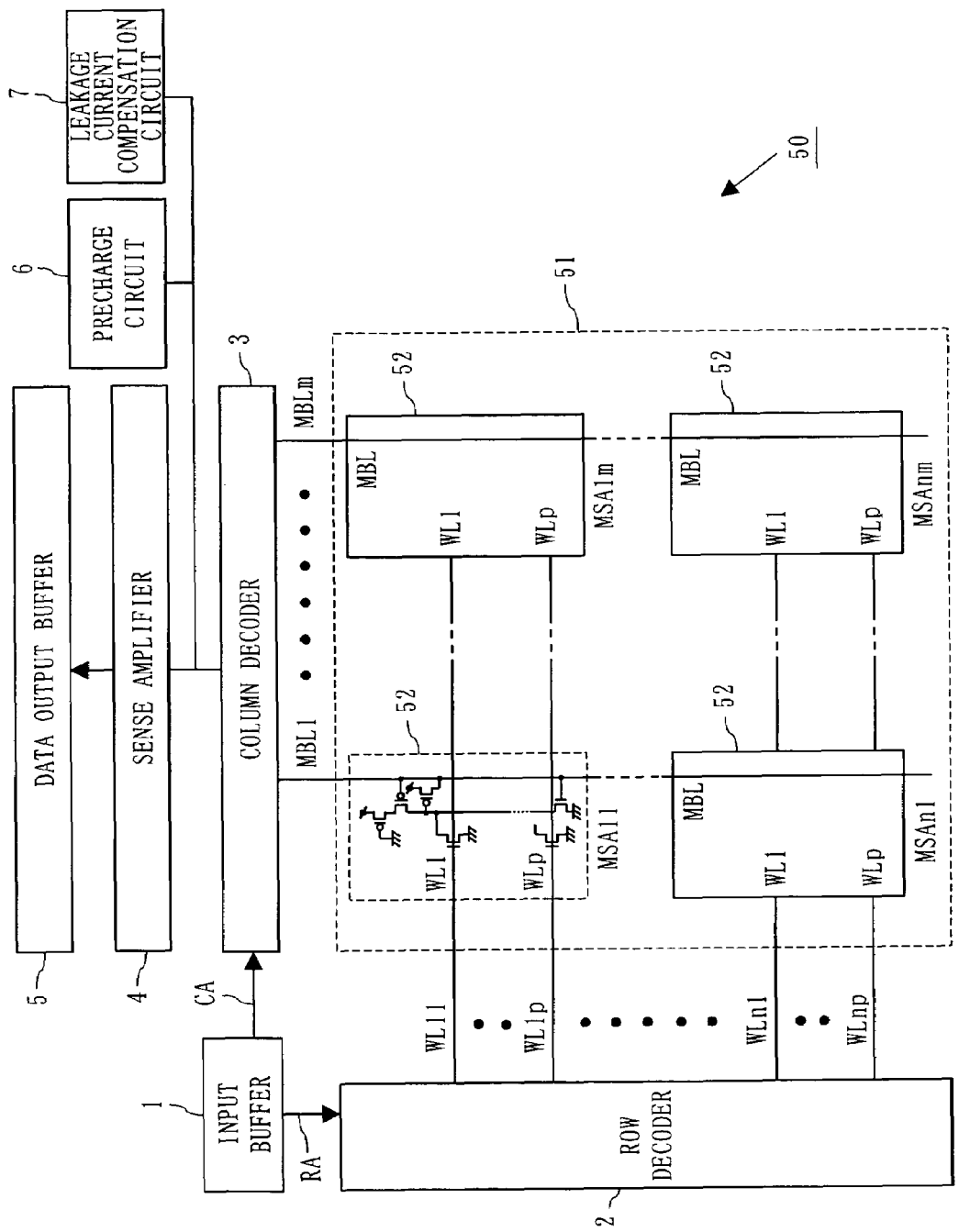
FIG. 14 is a block diagram illustrating a structure of a semiconductor memory device according to a fifth embodiment of the present invention.

FIG. 14 is a block diagram illustrating a structure of a semiconductor memory device according to a fifth embodiment of the present invention. The semiconductor memory device 50 of FIG. 14 is the same as the semiconductor memory device (FIG. 1) of the first embodiment, except that a memory cell array 51 and subarrays 52 are provided in place of the memory cell array 11 and the subarrays 12. In the fifth embodiment, the same constituents as those of the first embodiment are indicated with the same reference characters and will not be explained.

Figure 15:
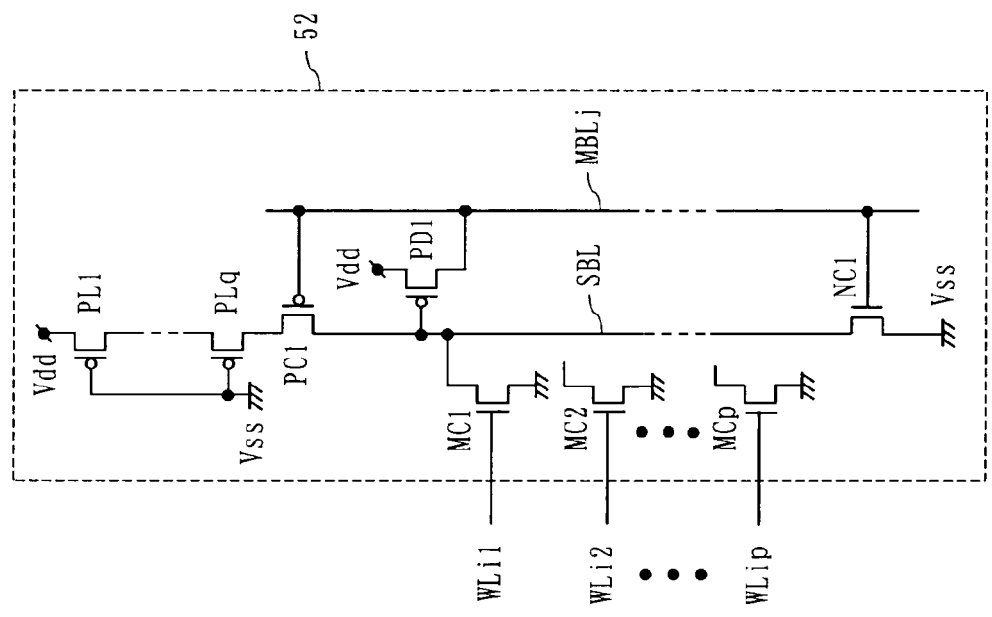
FIG. 15 is a diagram illustrating a structure of a subarray included in the semiconductor memory device of FIG. 14.

FIG. 15 is a diagram illustrating a structure of the subarray 52 provided on the i-th row and the j-th column in the memory cell array 51. The subarray 52 is the same as the subarray 12 (FIG. 2) of the first embodiment, except that q current limiting transistors PL1 to PLq connected in series are additionally provided between the first transistor PC1 and the power source voltage Vdd.

The current limiting transistors PL1 to PLq are each composed of a P-channel MOS transistor. The current limiting transistor PL1 has a source electrode connected to the power source voltage Vdd. The drain electrode of a current limiting transistor PLa is connected to the source electrode of a current limiting transistor PL(a+1), where a is an integer of 1 or more and less than q. The drain electrode of the current limiting transistor PLq is connected to the source electrode of the first transistor PC1. The gate electrodes of the current limiting transistors PL1 to PLq are connected to the ground voltage Vss. Therefore, the current limiting transistors PL1 to PLq are always in the ON state, and have a role in reducing the current drive ability of the first transistor PC1. Thus, the current limiting transistors PL1 to PLq function as a current limiting circuit.

As has been described in the first embodiment, when data 1 is read from a memory cell in the subarray 12, both of the first transistor PC1 and the memory cell MCA are in the ON state in the time interval T13, so that the potential of the sub-bit line SBL is at a level which is determined by the current drive ability of the first transistor PC1 and the current drive ability of the memory cell MCA. In order to cause the potential of the sub-bit line SBL to be at the L level in the time interval T13, the current drive ability of the first transistor PC1 may be caused to be sufficiently smaller than the current drive ability of a single memory cell.

However, in some cases, depending on the characteristics of the manufacturing process, the current drive ability of the single first transistor PC1 cannot be sufficiently smaller than the current drive ability of each memory cell. For example, a current is not sufficiently reduced even when a transistor of a minimum size which can be manufactured is used.

In view of this, the semiconductor memory device of this embodiment comprises a current limiting circuit composed of the current limiting transistors PL1 to PLq, for each subarray. Thereby, a required level of current drive ability can be achieved irrespective of the characteristics of the manufacturing process. Note that a resistance element having a preferable resistance value may be used in place of the current limiting transistors PL1 to PLq, so that a similar effect is obtained.

Sixth Embodiment

Figure 16:
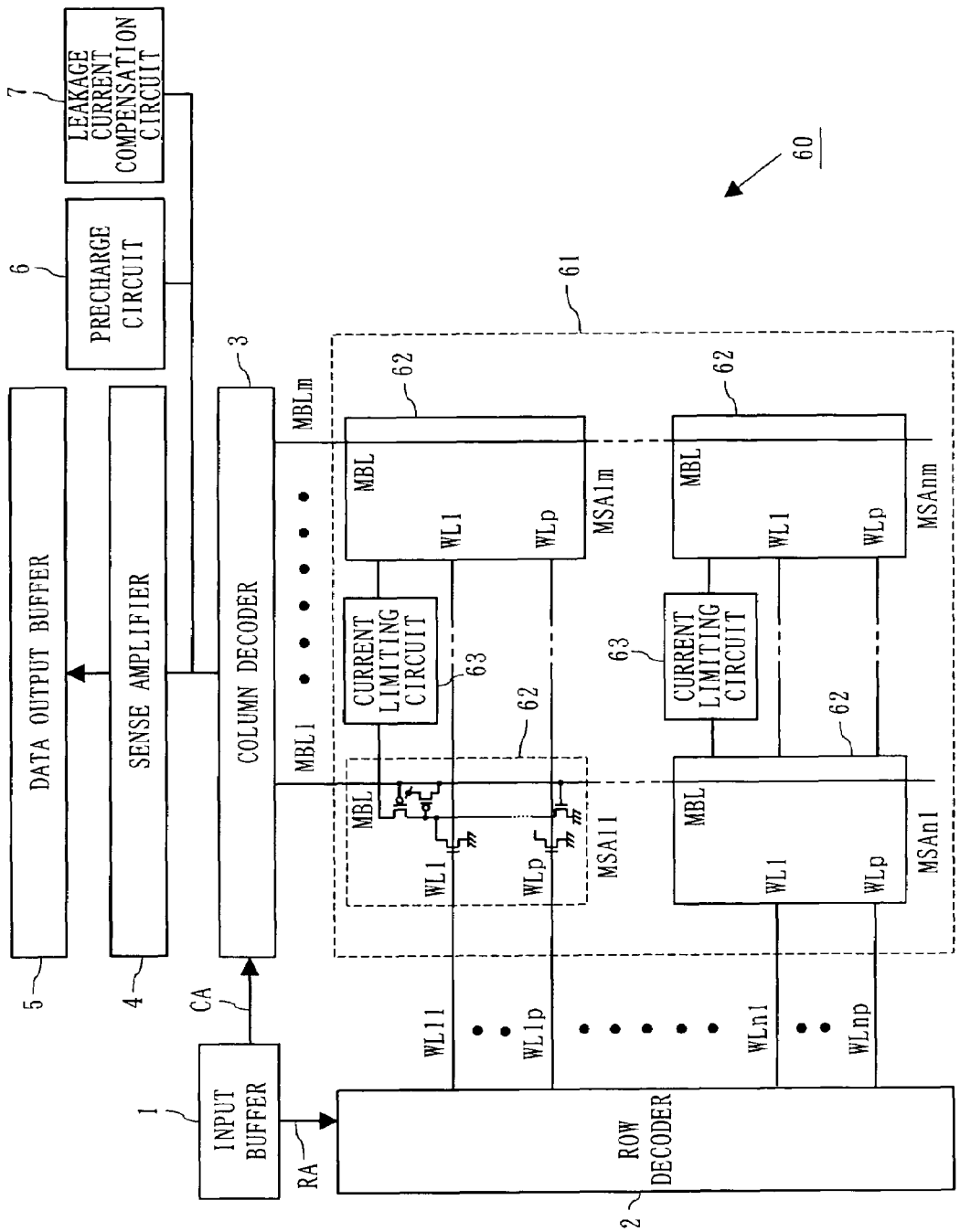
FIG. 16 is a block diagram illustrating a structure of a semiconductor memory device according to a sixth embodiment of the present invention.

FIG. 16 is a block diagram illustrating a structure of a semiconductor memory device according to a sixth embodiment of the present invention. The semiconductor memory device 60 of FIG. 16 is the same as the semiconductor memory device (FIG. 1) of the first embodiment, except that a memory cell array 61 and subarrays 62 are provided in place of the memory cell array 11 and the subarrays 12. In the sixth embodiment, the same constituents as those of the first embodiment are indicated with the same reference characters and will not be explained.

Figure 17:
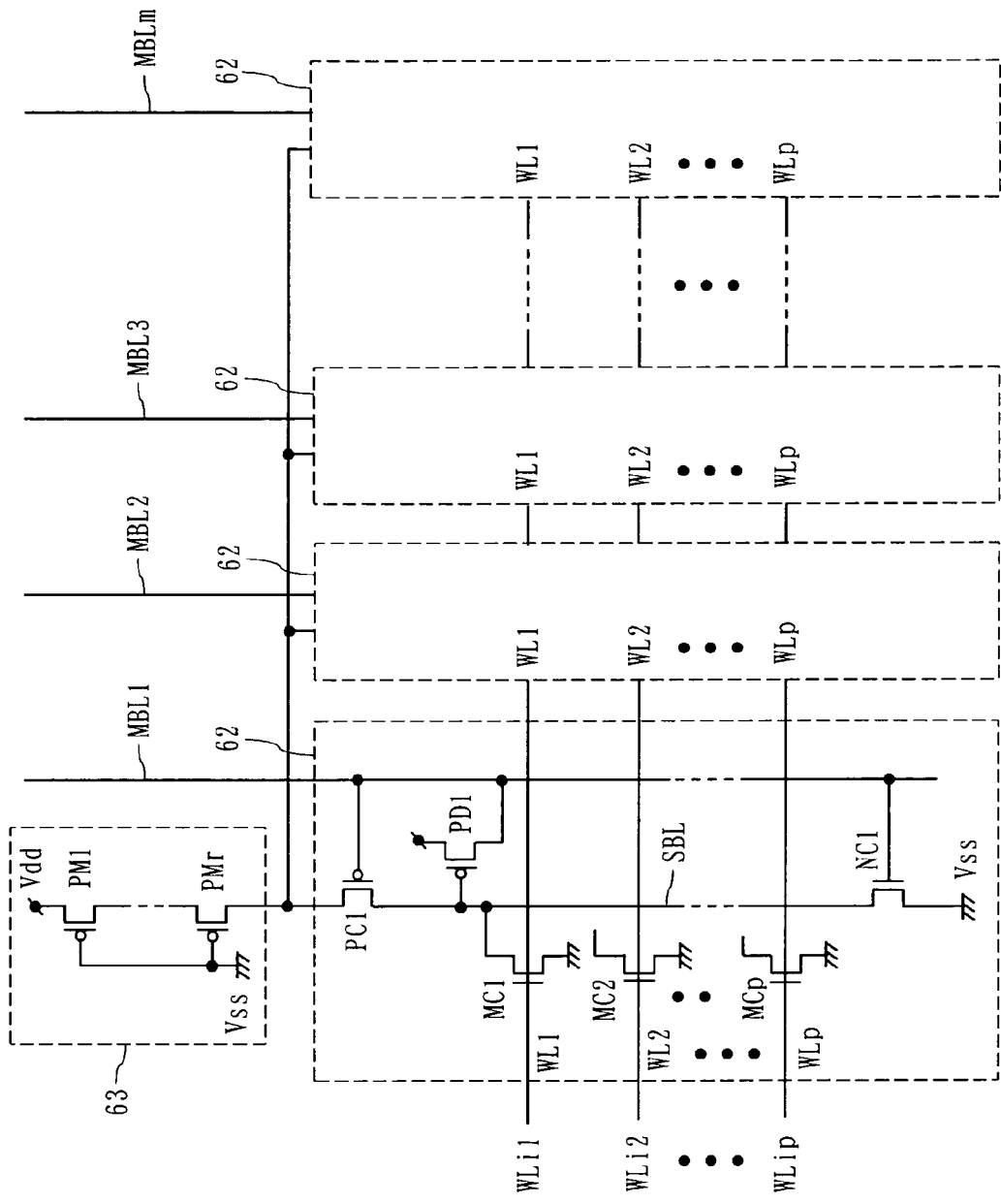
FIG. 17 is a diagram illustrating a structure of a subarray included in the semiconductor memory device of FIG. 16.
Figure 19:
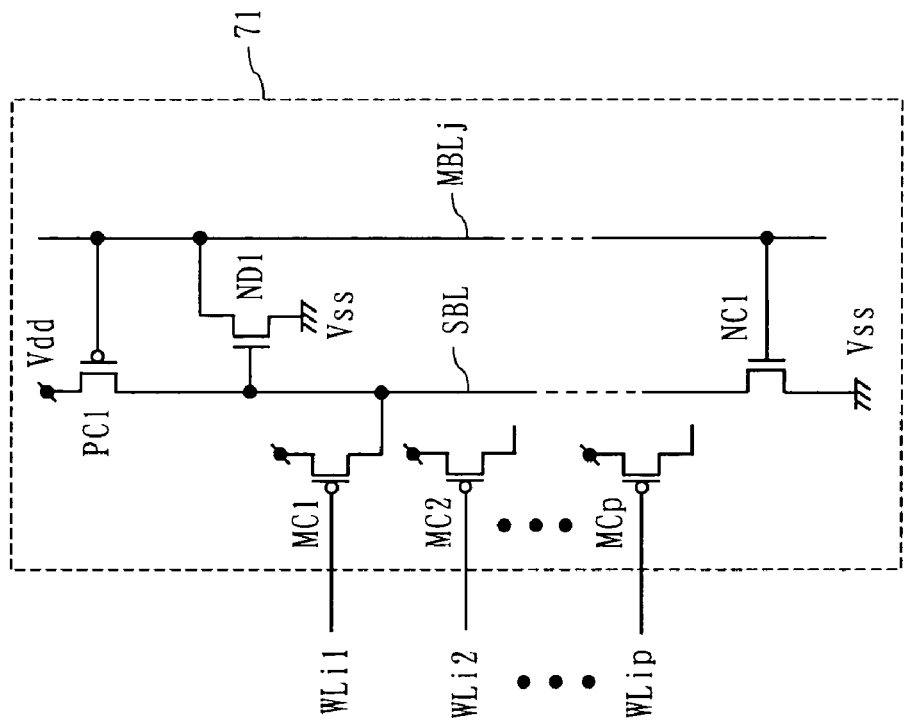
FIG. 19 is a diagram illustrating another structure of a subarray included in the semiconductor memory device of the embodiment of the present invention.

FIG. 17 is a diagram illustrating structures of subarrays 62 and a current limiting circuit 63 which are provided on the i-th row in the memory cell array 61. The current limiting circuit 63 includes r current limiting transistors PM1 to PMr connected in series. The current limiting transistors PM1 to PMr are each composed of a P-channel MOS transistor. The source electrode of the current limiting transistor PM1 is connected to the power source voltage Vdd. The drain electrode of a current limiting transistor PMb is connected to the source electrode of a current limiting transistor PM(b+1), where b is an integer of 1 or more and less than r.

The subarray 62 is the same as the subarray 12 (FIG. 2) of the first embodiment, except that the source electrode of the first transistor PC1 is connected to the drain electrode of the current limiting transistor PMr. Thus, in all of subarrays MSA11 to MSAim placed on the i-th row, the source electrode of the first transistor PC1 is connected to the drain electrode of the current limiting transistor PMr.

The gate electrodes of the current limiting transistors PM1 to PMr are connected to the ground voltage Vss. Therefore, the current limiting transistors PM1 to PMr are always in the ON state, and have a role in reducing the current drive ability of the first transistor PC1 in the subarrays 62 placed on the i-th row.

Although the semiconductor memory device 60 of FIG. 16 comprises a current limiting circuit 63 for each row of subarrays, instead of this, a current limiting circuit may be provided every a portion of subarrays placed on the same row, or every column of subarrays. In addition, in the current limiting circuit 63, a resistance element having a preferable resistance value may be provided in place of the current limiting transistors PM1 to PMr.

As described above, the semiconductor memory device of this embodiment comprises a current limiting circuit every a plurality of subarrays. Thereby, a required level of current drive ability can be achieved and an increase in layout area can be suppressed, irrespective of the characteristics of the manufacturing process.

Other Embodiments

Figure 18:
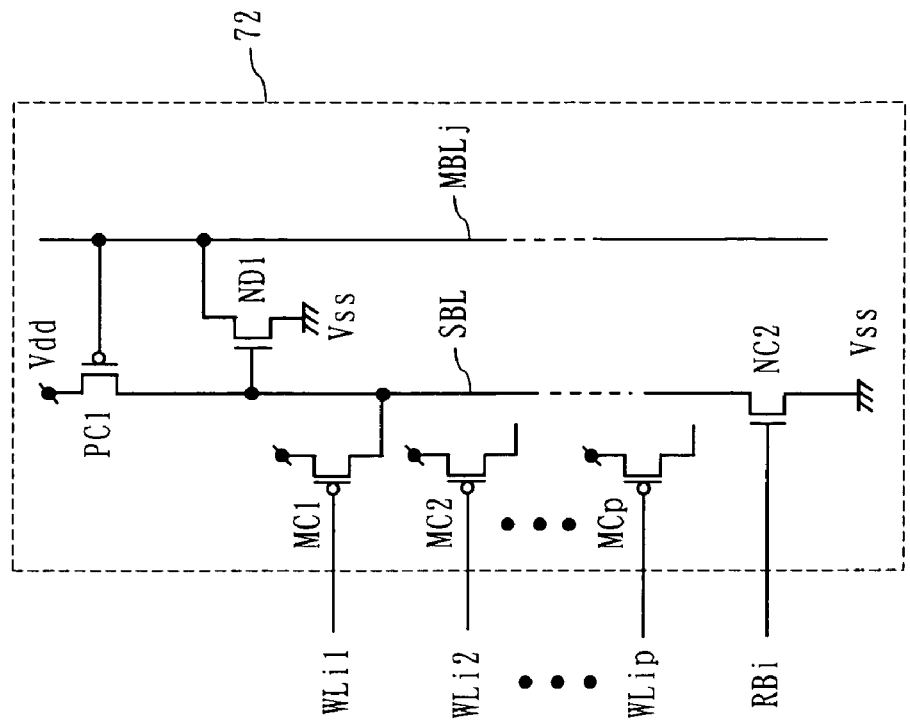
FIG. 18 is a diagram illustrating another structure of a subarray included in the semiconductor memory device of the embodiment of the present invention.
Figure 21:
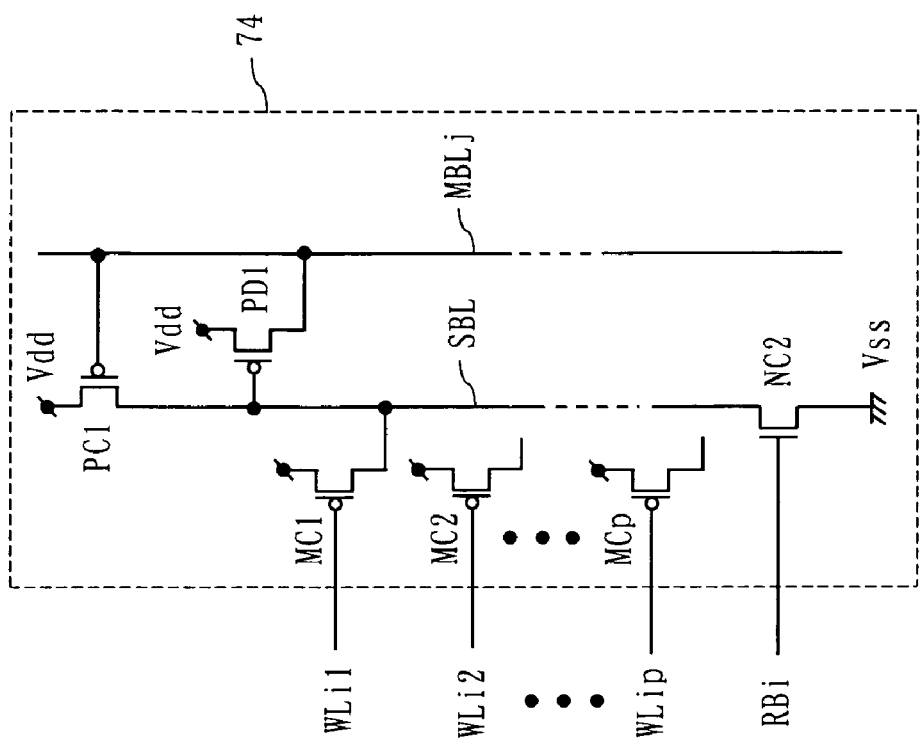
FIG. 21 is a diagram illustrating another structure of a subarray included in the semiconductor memory device of the embodiment of the present invention.
Figure 20:
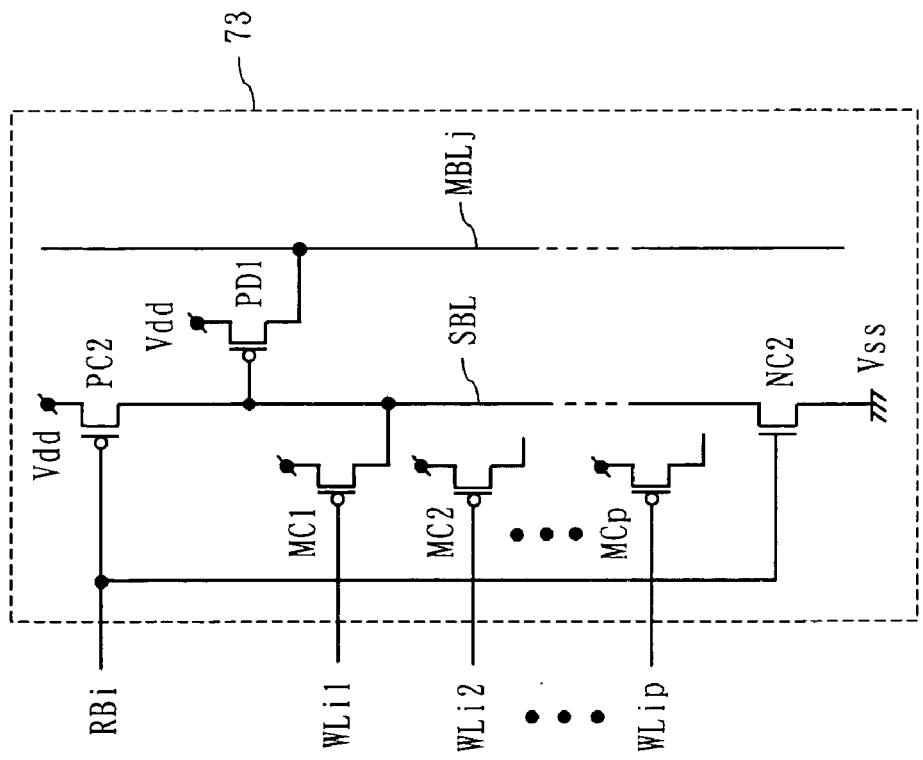
FIG. 20 is a diagram illustrating another structure of a subarray included in the semiconductor memory device of the embodiment of the present invention.
Figure 22:
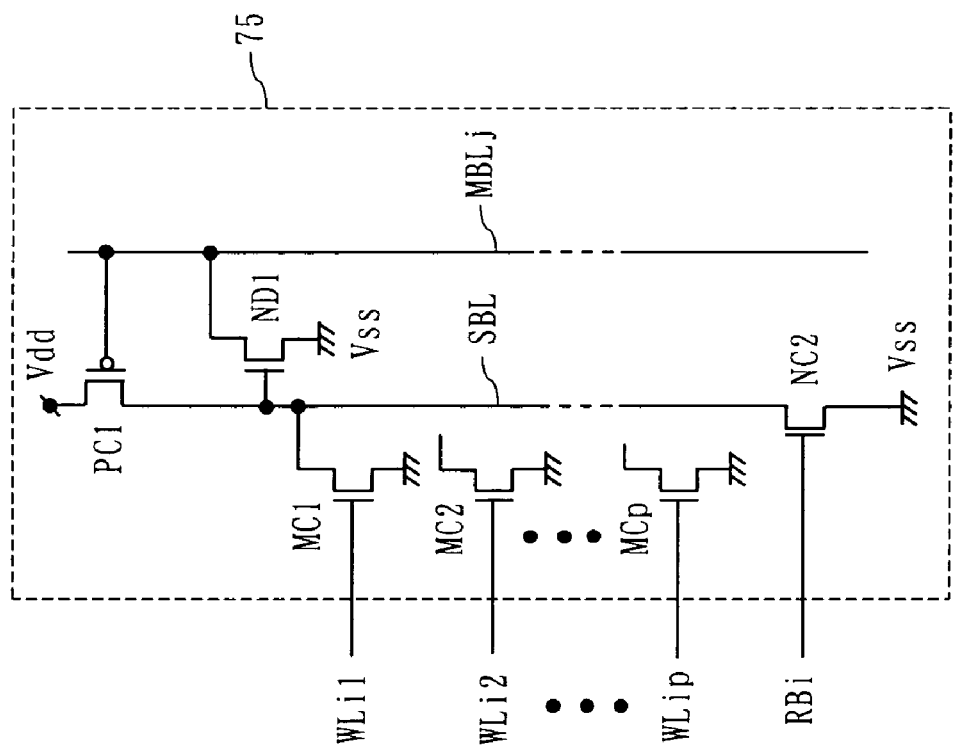
FIG. 22 is a diagram illustrating another structure of a subarray included in the semiconductor memory device of the embodiment of the present invention.
Figure 23:
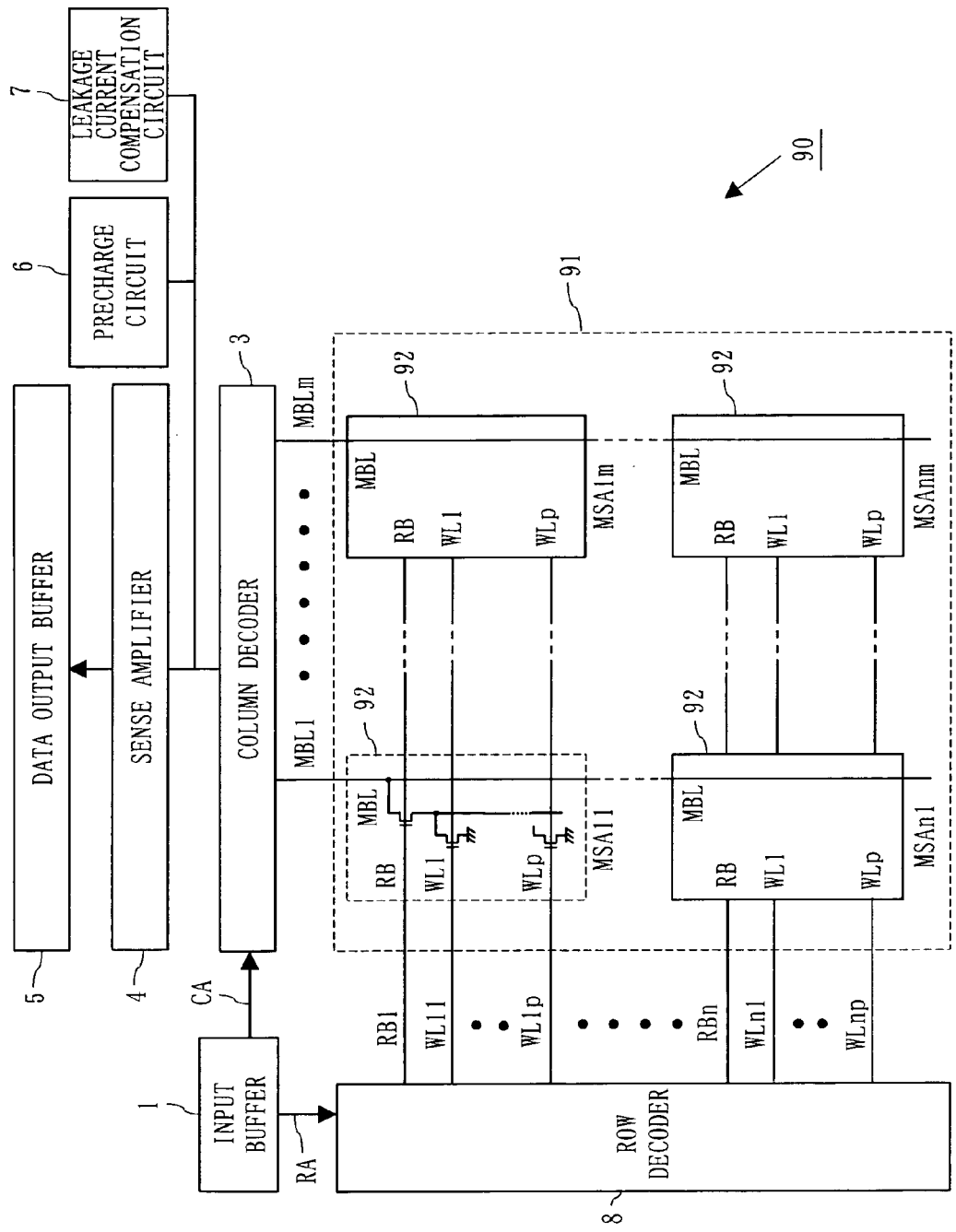
FIG. 23 is a block diagram illustrating a structure of a conventional semiconductor memory device.
Figure 24:
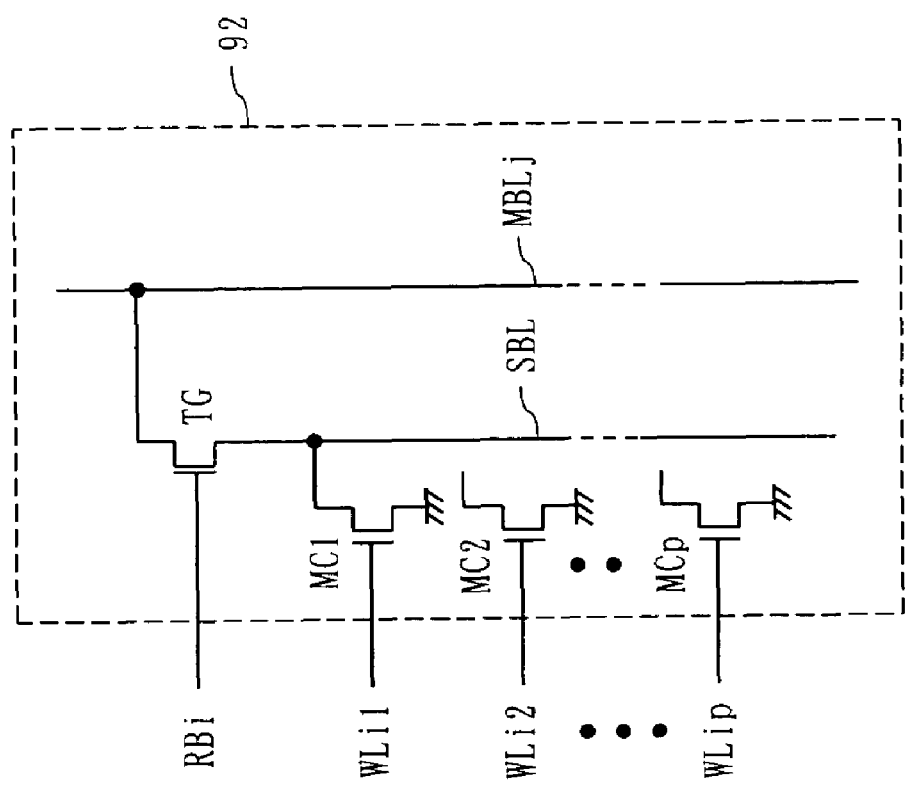
FIG. 24 is a diagram illustrating a subarray included in a conventional semiconductor memory device.
Figure 25:
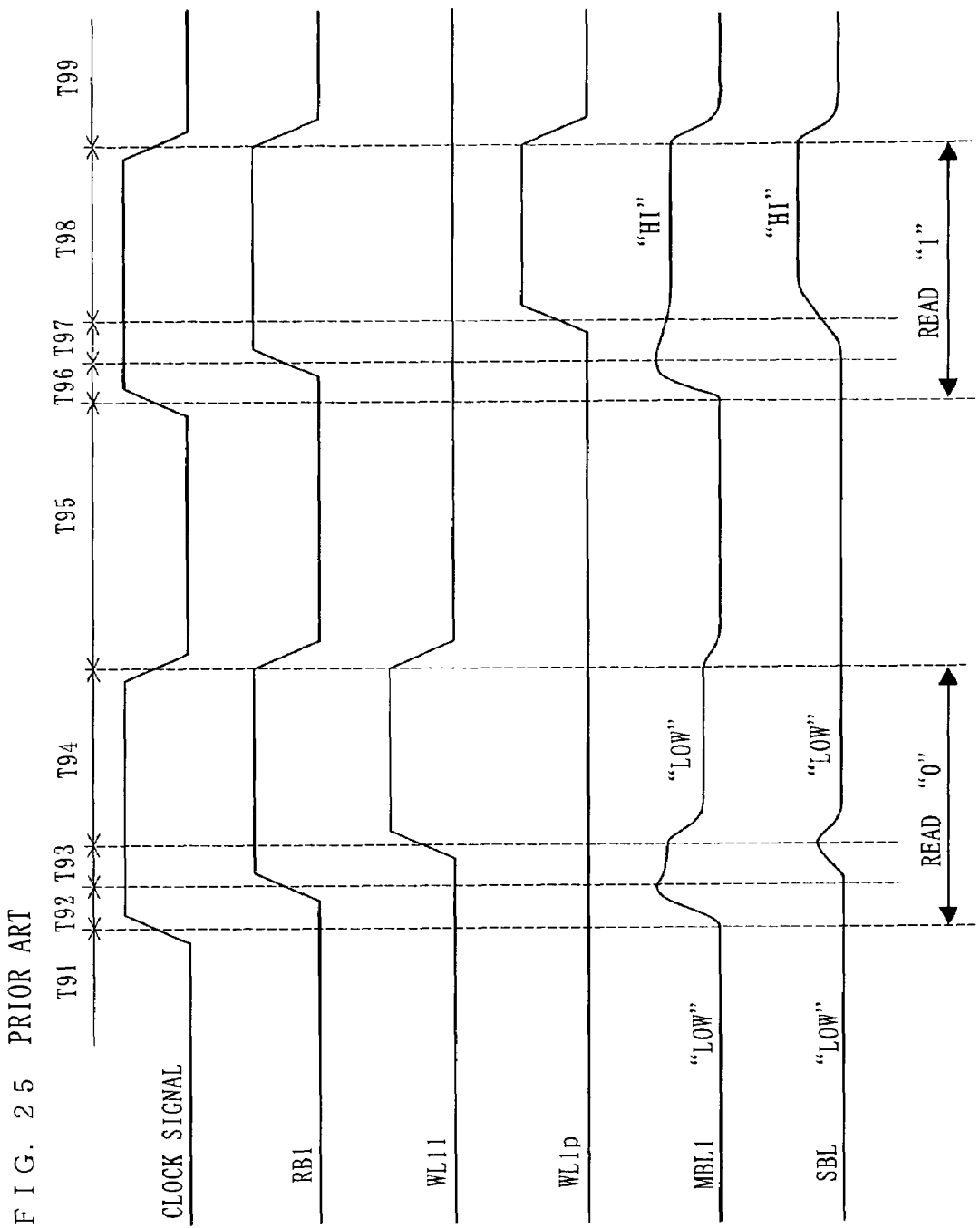
FIG. 25 is a diagram illustrating waveforms during an operation of a conventional semiconductor memory device.

A masked ROM which stores data, depending on the presence or absence of contact connection has been heretofore described in the first to sixth embodiments of the present invention. The present invention can be applied to other semiconductor memory devices. A masked ROM may comprise subarrays other than those of the first to fourth embodiments. For example, a subarray 71 illustrated in FIG. 18 can be used in place of the subarray 12 of the semiconductor memory device 10 of the first embodiment. In addition, subarrays 72 to 75 illustrated in FIGS. 19 to 22 can be used in place of the subarrays 22, 32, and 42 of the semiconductor memory devices 20, 30, and 40 of the second to fourth embodiments.

A semiconductor memory device comprising any one of the subarrays 71 to 75 has an operation similar to those of the semiconductor memory devices of the first to fourth embodiments, and will not be herein explained. Note that the semiconductor memory devices comprising the subarrays 71 to 74 have a signal having a reverse polarity as follows. Before performing a read operation, the voltage of the main bit line MBLj or the row block select line RBi is controlled to be at the H level, so that the voltage of the sub-bit line SBL is at the L level. In a memory cell storing data 0, the sub-bit line SBL is connected to the power source voltage Vdd during the time when the voltage of a corresponding word line is at the L level (a level corresponding to the selected state). Therefore, the voltage of the sub-bit line SBL transitions to the H level, and the third transistor ND1 transitions to the ON state (or the third transistor PD1 transitions to the OFF state). Therefore, the voltage of the main bit line MBLj is caused to be at the L level by an action of the third transistor ND1 or a precharge circuit. On the other hand, in a memory cell storing data 1, even when the voltage of a corresponding word line transitions to the H level (a level corresponding to the non-selected), the sub-bit line SBL is not connected to the power source voltage Vdd. Therefore, the voltage of the sub-bit line SBL is held at the L level, and the third transistor ND1 is held in the OFF state (or the third transistor PD1 is held in the ON state). Therefore, the voltage of the main bit line MBLj is caused to be at the H level by an action of the third transistor PD1 or the precharge circuit. In this manner, data stored in the memory cells MC1 to MCp can be correctly read.

Alternatively, the drain electrodes of MOS transistors included in memory cells may be always connected to a sub-bit line, and the threshold voltages of the MOS transistors included in the memory cells may differ from each other, depending on stored data. In this case, when a memory cell stores a predetermined value (a value corresponding to the case where the drain electrode is not connected to the sub-bit line), it is preferable that the threshold voltage of the MOS transistor of the memory cell is so large that the conduction is not established between the source electrode and the drain electrode, even if the word line connected to the gate electrode is selected. Thus, even when MOS transistors having threshold values varying depending on stored data are used, an effect similar to that obtained when MOS transistors having connection states between the drain electrode and the sub-bit line varying depending on stored data, is obtained.

The current limiting circuit illustrated in the fifth and sixth embodiments may be provided in the semiconductor memory devices 20, 30, and 40 of the second to fourth embodiments, or a semiconductor memory device comprising any of the subarrays 71 to 75 of FIGS. 18 to 22.

The present invention can also be applied to other semiconductor memory devices, such as a flash memory, an SRAM, a DRAM, and the like, in addition to a masked ROM. Hereinafter, as an example, an SRAM which has the same configuration of main bit lines, sub-bit lines, and first to third transistors as that of the first to fourth embodiments, and includes memory cells for storing externally written data in place of the memory cells of the first to fourth embodiments, will be described.

In the SRAM, a node present in a memory cell is at the L level or the H level, depending on data stored in the memory cell. As in the first to fourth embodiments, the voltage of a sub-bit line is controlled to a predetermined level before performing a read operation. In addition, when a word line connected to a memory cell is selected, the node in the memory cell is connected to a sub-bit line. Thereby, an influence corresponding to data stored in the memory cell is applied to the voltage of the sub-bit line. Therefore, when a word line connected to a memory cell is selected, the voltage of a sub-bit line is at the L level or the H level, depending on data stored in the memory cell. According to the same principle as that of the semiconductor memory devices of the first to fourth embodiments in respects other than those described above, data stored in a memory cell can be correctly read.

As described above, the semiconductor memory device of the present invention comprises, in a subarray, a third switch section which switches whether or not a main bit line is connected to a predetermined power source, depending on the voltage of a sub-bit line, in place of a transfer gate between a main bit line and a sub-bit line. Thereby, an influence of ON-resistance in the transfer gate can be removed, and in addition, data can be read from a memory cell with high speed and a read limit voltage can be reduced in a low voltage region in which a significant mismatch occurs between a threshold voltage and a power source voltage.

The semiconductor memory device of the present invention has a hierarchical bit line structure and achieves a high speed and a low voltage, and therefore, can be utilized as various semiconductor memory devices, such as a masked ROM, a flash memory, an SRAM, a DRAM, and the like.

While the invention has been described in detail, the foregoing description is in all aspects illustrative and not restrictive. It is understood that numerous other modifications and variations can be devised without departing from the scope of the invention.

What is claimed is:

1. A semiconductor memory device with a hierarchical bit line structure, comprising:
   a plurality of subarrays arranged in a row direction and a column direction;
   a plurality of word lines connected to the subarrays placed on the respective same rows;
   a plurality of main bit lines connected to the subarrays placed on the respective same columns;
   a row decoder for selecting one of the word lines, based on a given row address;
   a column decoder for selecting one of the main bit lines, based on a given column address; and
   a main bit line control circuit for controlling the main bit line selected by the column decoder,
   wherein the subarray includes:
      a sub-bit line;
      a first switch section for switching whether or not the sub-bit line is connected to a power source voltage;
      a second switch section for switching whether or not the sub-bit line is connected to a ground voltage;
      a third switch section for switching whether or not the main bit line is connected to a predetermined power source, based on a voltage of the sub-bit line; and
      a plurality of memory cells for applying an influence depending on data stored therein, onto the sub-bit line, when a corresponding one of the word lines is selected.

2. The semiconductor memory device according to claim 1, wherein the voltage of the sub-bit line is caused to be at a first level when one of the first and second switch section becomes conductive, before a read operation, and
   the memory cell, when a corresponding word line is selected, does or does not connect a node having a voltage of a second level different from the first level with the sub-bit line, depending on data therein.

3. The semiconductor memory device according to claim 2, wherein, after the word line is selected, the voltage of the sub-bit line has a level which allows the third switch section to be conductive, or a level which does not allow the third switch section to be conductive, depending on a value stored in the memory cell connected to the word line.

4. The semiconductor memory device according to claim 2, wherein the memory cell has a MOS transistor having a source electrode connected to the power source voltage or the ground voltage, a gate electrode connected to the corresponding word line, and a drain electrode whose connected state with respect to the sub-bit line varies depending on data stored therein.

5. The semiconductor memory device according to claim 2, wherein the memory cell has a MOS transistor having a source electrode connected to the power source voltage or the ground voltage, a drain electrode connected to the sub-bit line, a gate electrode connected to the corresponding word line, and a threshold voltage varying depending on data stored therein.

6. The semiconductor memory device according to claim 5, wherein the threshold voltage of the MOS transistor is so large that conduction is not established between the source electrode and the drain electrode when the stored data has a predetermined value, even if the word line connected to the gate electrode is selected.

7. The semiconductor memory device according to claim 1, wherein the main bit line control circuit includes:
   a sense amplifier for amplifying a signal on the main bit line selected by the column decoder;
   a precharge circuit for charging the main bit line selected by the column decoder; and
   a leakage current compensation circuit for supplying electric charge to the main bit line selected by the column decoder in an amount corresponding to a leakage current.

8. The semiconductor memory device according to claim 1, wherein the predetermined power source supplies the power source voltage,
   the first switch section includes a P-channel MOS transistor having a source electrode connected to the power source voltage, a drain electrode connected to the sub-bit line, and a gate electrode connected to the main bit line,
   the second switch section includes an N-channel MOS transistor having a source electrode connected to the ground voltage, a drain electrode connected to the sub-bit line, and a gate electrode connected to the main bit line,
   the third switch section includes a P-channel MOS transistor having a source electrode connected to the predetermined power source, a drain electrode connected to the main bit line, and a gate electrode connected to the sub-bit line, and
   the memory cell does or does not connect a node having a low level voltage with the sub-bit line, depending on data stored therein, when the corresponding word line is selected.

9. The semiconductor memory device according to claim 8, wherein a voltage of the main bit line is controlled, initially, to be at a high level, and, before a read operation, to be at a low level, and
   a voltage of the word line is controlled, initially, to be at a level corresponding to a non-selected state, and, after the voltage of the main bit line is controlled to be at the low level, to be at a level corresponding to a selected state.

10. The semiconductor memory device according to claim 9, wherein, after the voltage of the word line is controlled to be at the level corresponding to the selected state, the voltage of the sub-bit line is at a low level which is equal to or lower than a threshold voltage of the third switch section, or at a high level which is higher than the threshold voltage of the third switch section, depending on a value stored in the memory cell connected to the word line.

11. The semiconductor memory device according to claim 10, wherein the first switch section has a current drive ability smaller than that of the single memory cell, and is larger than a total amount of cut-off leakage currents of all of the memory cells connected to the single sub-bit line.

12. The semiconductor memory device according to claim 1, further comprising a plurality of row block select lines connected to the subarrays on the respective rows,
   wherein the row decoder selects one of the row block select lines.

13. The semiconductor memory device according to claim 12, wherein the predetermined power source supplies the power source voltage,
   the first switch section includes a P-channel MOS transistor having a source electrode connected to the power source voltage, a drain electrode connected to the sub-bit line, and a gate electrode connected to the row block select line,
   the second switch section includes an N-channel MOS transistor having a source electrode connected to the ground voltage, a drain electrode to the sub-bit line, and a gate electrode connected to the main bit line, the third switch section includes a P-channel MOS transistor having a source electrode connected to the predetermined power source, a drain electrode connected to the main bit line, and a gate electrode connected to the sub-bit line, and the memory cell does or does not connect a node having a low level voltage with the sub-bit line, depending on data stored therein, when the corresponding word line is selected.

14. The semiconductor memory device according to claim 13, wherein a voltage of the main bit line is controlled, initially, to be at a low level, a voltage of the word line is controlled, initially, to be at a level corresponding to a non-selected state, and, before a read operation, to be a level corresponding to a selected state, and a voltage of the row block select line is controlled, initially, to be at a low level, and, after the voltage of the word line is controlled to be at the level corresponding to the selected state, to be at a high level.

15. The semiconductor memory device according to claim 14, wherein, after the voltage of the row block select line is controlled to be at the high level, the voltage of the sub-bit line is at a low level which equal to or lower than a threshold voltage of the third switch section, or at a high level which is higher than the threshold voltage of the third switch section, depending on a value stored in the memory cell connected to the word line.

16. The semiconductor memory device according to claim 12, wherein the predetermined power source supplies the ground voltage, the first switch section includes a P-channel MOS transistor having a source electrode connected to the power source voltage, a drain electrode connected to the sub-bit line, and a gate electrode connected to the row block select line, the second switch section includes an N-channel MOS transistor having a source electrode connected to the ground voltage, a drain electrode to the sub-bit line, and a gate electrode connected to the row block select line, the third switch section includes an N-channel MOS transistor having a source electrode connected to the predetermined power source, a drain electrode connected to the main bit line, and a gate electrode connected to the sub-bit line, and the memory cell does or does not connect a node having a low level voltage with the sub-bit line, depending on data stored therein, when the corresponding word line is selected.

17. The semiconductor memory device according to claim 16, wherein a voltage of the main bit line is controlled, initially, to be at a high level, a voltage of the row block select line is controlled, initially, to be at a high level, and, before a read operation, to be at a low level, and a voltage of the word line is controlled, initially, to be at a level corresponding to a non-selected state, and, after the voltage of the row block select line is controlled to be at the low level, to be a level corresponding to a selected state.

18. The semiconductor memory device according to claim 17, wherein, after the voltage of the word line is controlled to be at the level corresponding to the selected state, the voltage of the sub-bit line is at a high level which is equal to or higher than a threshold voltage of the third switch section, or at a low level which is lower than the threshold voltage of the third switch section, depending on a value stored in the memory cell connected to the word line.

19. The semiconductor memory device according to claim 18, wherein the first switch section has a current drive ability smaller than that of the single memory cell, and is larger than a total amount of cut-off leakage currents of all of the memory cells connected to the single sub-bit line.

20. The semiconductor memory device according to claim 12, wherein the predetermined power source supplies the ground voltage, the first switch section includes a P-channel MOS transistor having a source electrode connected to the power source voltage, a drain electrode connected to the sub-bit line, and a gate electrode connected to the row block select line, the second switch section includes an N-channel MOS transistor having a source electrode connected to the ground voltage, a drain electrode to the sub-bit line, and a gate electrode connected to the main bit line, the third switch section includes an N-channel MOS transistor having a source electrode connected to the predetermined power source, a drain electrode connected to the main bit line, and a gate electrode connected to the sub-bit line, and the memory cell does or does not connect a node having a low level voltage with the sub-bit line, depending on data stored therein, when the corresponding word line is selected.

21. The semiconductor memory device according to claim 20, wherein a voltage of the main bit line is controlled, initially, to be at a high level, and, before a read operation, to be at a low level, a voltage of the row block select line is controlled, initially, to be at a high level, and, after the voltage of the main bit line is controlled to be at the low level, to be at a low level, a voltage of the word line is controlled, initially, to be at a level corresponding to a non-selected state, and, after the voltage of the row block select line is controlled to be at the low level, to be a level corresponding to a selected state, and after the voltage of the word line is controlled to be the level corresponding to the selected state, a voltage of the high level is applied to the main bit line, and thereafter, the voltage of the main bit line is at the low level or the high level, depending on whether or not the third switch section is conductive or not.

22. The semiconductor memory device according to claim 21, wherein, after the voltage of the word line is controlled to be at the level corresponding to the selected state, the voltage of the sub-bit line is at a high level which is equal to or higher than a threshold voltage of the third switch section, or at a low level which is lower than the threshold voltage of the third switch section, depending on a value stored in the memory cell connected to the word line.

23. The semiconductor memory device according to claim 22, wherein the first switch section has a current drive ability smaller than that of the single memory cell, and is larger than a total amount of cut-off leakage currents of all of the memory cells connected to the single sub-bit line.

24. The semiconductor memory device according to claim 1, further comprising a current limiting circuit of limiting an amount of a current flowing through the sub-bit line, the current limiting circuit being provided between the first switch section and the power source voltage.

25. The semiconductor memory device according to claim 24, wherein the current limiting circuit includes one or more MOS transistors connected in series and each having a gate electrode to which a fixed voltage is applied.

26. The semiconductor memory device according to claim 24, wherein the current limiting circuit includes a resistance element.

27. The semiconductor memory device according to claim 24, wherein the current limiting circuit is provided for each of the subarrays.

28. The semiconductor memory device according to claim 24, wherein the current limiting circuit is provided for each set of a plurality of the subarrays.

* * * * *